(12) United States Patent
Tan et al.

(10) Patent No.: US 6,638,683 B1
(45) Date of Patent: *Oct. 28, 2003

(54) POSITIVE PHOTORESIST COMPOSITION

(75) Inventors: Shiro Tan, Shizuoka (JP); Toshiaki Aoai, Shizuoka (JP); Toru Fujimori, Shizuoka (JP)

(73) Assignee: Fuji Photo Film Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,544

(22) Filed: Jun. 24, 1998

(30) Foreign Application Priority Data

Jun. 24, 1997 (JP) ............................................. 9-167405
Sep. 30, 1997 (JP) ............................................. 9-267026

(51) Int. Cl.$^7$ ............................. G03C 1/73; G03F 7/039
(52) U.S. Cl. ................................ 430/270.1; 430/287.1; 430/905; 430/326; 430/914
(58) Field of Search ........................ 430/270.1, 287.1, 430/905, 914, 917, 325–326, 909; 525/328.8

(56) References Cited

U.S. PATENT DOCUMENTS

| | | | |
|---|---|---|---|
| 5,110,709 A | * 5/1992 | Aoai et al. | 430/271.1 |
| 5,550,004 A | * 8/1996 | Honda | 430/270.1 |
| 5,639,587 A | 6/1997 | Sato et al. | 430/190 |
| 5,750,309 A | * 5/1998 | Hatakeyama et al. | 430/270.1 |
| 5,827,634 A | * 10/1998 | Thackeray et al. | 430/270.1 |
| 5,852,128 A | * 12/1998 | Padmanaban et al. | 525/328.8 |
| 5,856,561 A | * 1/1999 | Nagata et al. | 560/57 |
| 5,928,841 A | * 7/1999 | Ushirogouchi et al. | 430/325 |
| 5,945,250 A | * 8/1999 | Aoai et al. | 430/270.1 |

FOREIGN PATENT DOCUMENTS

| | | |
|---|---|---|
| EP | 0540032 | 5/1993 |
| EP | 0749046 | 12/1996 |
| EP | 0764884 | 3/1997 |

OTHER PUBLICATIONS

Chemical Structure for Anthrarobm provided by STN data base search (File 'Registy').*

* cited by examiner

Primary Examiner—Janet Baxter
Assistant Examiner—Sin J. Lee
(74) Attorney, Agent, or Firm—Sughrue Mion, PLLC

(57) ABSTRACT

A positive photoresist composition comprises the combination of (a) Resin A obtained from an alkali-soluble resin containing phenolic hydroxyl groups by replacing from 10 to 80% of the phenolic hydroxyl groups each with a group represented by formula (I) and (b) Resin B obtained from an alkali-soluble resin containing phenolic hydroxyl groups by replacing from 10 to 80% of the phenolic hydroxyl groups each with a group represented by formula (II) or (III) or a nonpolymeric dissolution inhibitive compound which has at least one kind of group selected from tertiary alkyl ester groups and tertiary alkyl carbonate groups;

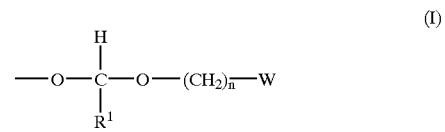

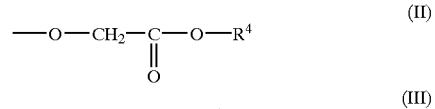

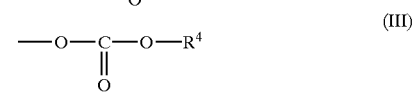

wherein $R^1$, W, n, and $R^4$ are as defined in the specification.

8 Claims, No Drawings

POSITIVE PHOTORESIST COMPOSITION

FIELD OF THE INVENTION

The present invention relates to a positive photoresist composition for use in the production of semiconductor IC elements, masks for IC production, printed circuit boards, liquid-crystal panels, etc.

BACKGROUND OF THE INVENTION

Conventional resists comprising a novolak and a naphthoquinonediazide compound are unsuitable for use in pattern formation by lithography using far ultraviolet rays or excimer laser beams, because the novolak and the naphthoquinonediazide show intense absorption in the far ultraviolet region to render the light less apt to reach the resist bottom. Thus, the resist has low sensitivity to give only a tapered pattern.

One means for eliminating the above problem is the chemically amplified resist composition described in, e.g., U.S. Pat. No. 4,491,628 and European Patent 29,139. A chemically amplified positive resist composition is a pattern-forming material in which an acid generates in exposed areas upon irradiation with a radiation such as far ultraviolet rays and this acid catalyzes a reaction that makes the areas irradiated with the actinic rays and the unirradiated areas to differ in solubility in a developing solution to thereby form a pattern on a substrate.

Examples thereof include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625), with a silyl ester compound (see JP-A-60-10247), and with a silyl ether compound (see JP-A-60-37549 and JP-A-60-121446). These combinations show high photosensitivity since they have a quantum efficiency exceeding 1 as the principle.

Another means for eliminating the problem described hereinabove is a system which is stable over long at room temperature but decomposes upon heating in the presence of an acid to become alkali-soluble. Examples thereof include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642; *Polym. Eng. Sce.,* Vol. 23, p. 12 (1983); *ACS. Sym.,* Vol. 242, p. 11 (1984); *Semiconductor World,* November 1987 issue, p. 91; *Macromolecules,* Vol. 21, p. 1475 (1988); and *SPIE,* Vol. 920, p. 42 (1988). Since these systems also have high sensitivity and show reduced absorption in the deep UV region as compared with the naphthoquinonediazide/novolak resin systems, they can be effective systems for coping with the utilization of the light source having shorter wavelength.

The chemically amplified positive resist compositions described above are roughly divided into three groups: three-component systems comprising an alkali-soluble resin, a compound which generates an acid upon exposure to a radiation (photo-acid generator), and a dissolution inhibitive compound for the alkali-soluble resin which has acid-decomposable groups; two-component systems comprising a resin having groups which decompose upon reaction with an acid to render the resin alkali-soluble and a photo-acid generator; and hybrid systems comprising a resin having groups which decompose upon reaction with an acid to render the resin alkali-soluble, a low-molecular dissolution inhibitive compound having an acid-decomposable group, and a photo-acid generator.

In JP-A-2-19847 is disclosed a resist composition characterized by containing a resin obtained from poly(p-hydroxystyrene) by protecting all or part of the phenolic hydroxyl groups each with a tetrahydropyranyl group.

In JP-A-4-219757 is disclosed a resist composition characterized by containing a resin obtained likewise from poly(p-hydroxystyrene) by replacing from 20 to 70% of the phenolic hydroxyl groups each with an acetal group.

Moreover, JP-A-5-249682 discloses a photoresist composition containing a similar resin protected with an acetal. In JP-A-8-123032 is disclosed a photoresist composition containing a terpolymer having groups substituted with acetal groups.

Furthermore, JP-A-8-253534 discloses a photoresist composition containing a partly crosslinked polymer having groups substituted with acetal groups.

JP-A-8-15864 discloses a positive resist composition comprising a mixture comprising as a resin component polyhydroxystyrene in which 10 to 60 mol % of hydroxy groups were replaced with t-butoxycarbonyloxy groups and polyhydroxystyrene in which 10 to 60 mol % of hydroxy groups were replaced with ethoxyethoxy groups.

However, these compositions have some problems such as unsatisfactory dimensional reproducibility of isolated patterns and generation of scum at lower parts of patterns after development. Solution of these problems has been desired.

SUMMARY OF THE INVENTION

An object of the present invention is to provide an excellent, chemically amplified positive photoresist composition which has high resolution and improved dimensional reproducibility of isolated patterns.

Another object of the present invention is to provide an excellent, chemically amplified positive photoresist composition which is prevented from generating a scum after development and has high resolution.

As a result of intensive investigations made by the present inventor under these circumstances, it has been found that a positive photoresist composition comprising a combination of two alkali-soluble resin binders each having a substituent having a different specific structure from each other, a compound which generates an acid upon irradiation with actinic rays or a radiation, and a solvent (first photoresist composition) shows high resolution and is effective in eliminating the above-described problem concerning the dimensional reproducibility of isolated patterns, and a positive photoresist composition comprising a combination of an alkali-soluble resin binder substituted with substituents of a specific structure and a nonpolymeric dissolution inhibitive compound having specific functional groups, a compound which generates an acid upon irradiation with actinic rays or a radiation, and a solvent (second photoresist composition) shows high resolution and is effective in eliminating the problem of scum generation described above. The present invention has been completed based on these findings.

(1) The first positive photoresist composition comprises:
(a) Resin A obtained from an alkali-soluble resin containing phenolic hydroxyl groups by replacing from 10 to 80% of the phenolic hydroxyl groups each with a group represented by the following formula (I); (b) Resin B obtained from an alkali-soluble resin containing phenolic hydroxyl groups by replacing from 10 to 80% of the phenolic hydroxyl groups each with a group represented by the following formula (II) or (III); (c) a compound which generates an acid upon irradiation with actinic rays or a radiation; and (d) a solvent,

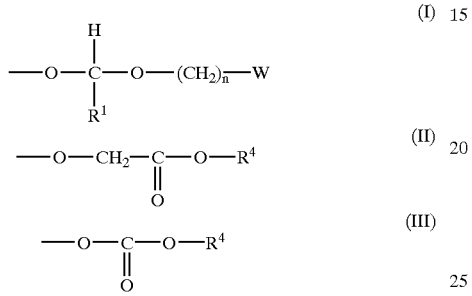

wherein $R^1$ represents a substituent selected from alkyl groups having 1 to 4 carbon atoms; W represents either an organic residue containing at least one atom selected from oxygen, nitrogen, sulfur, phosphorus, and silicon atoms or an atomic group selected from the group consisting of an amino group, an ammonium group, and a mercapto group;

n represents a natural number of from 1 to 4; and $R^4$ represents a linear, branched, or cyclic alkyl group having 1 to 6 carbon atoms.

(2) The second positive photoresist composition comprises:
(a) Resin A obtained from an alkali-soluble resin containing phenolic hydroxyl groups by replacing from 10 to 80% of the phenolic hydroxyl groups each with a group represented by formula (I);
(b) a nonpolymeric dissolution inhibitive compound which has at least one kind of group selected from tertiary alkyl ester groups and tertiary alkyl carbonate groups, and is capable of enhancing solubility in aqueous alkali solutions by the action of an acid;
(c) a compound which generates an acid upon irradiation with actinic rays or a radiation; and
(d) a solvent,

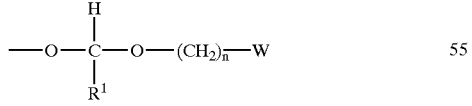

wherein $R^1$ represents a substituent selected from alkyl groups having 1 to 4 carbon atoms; W represents either an organic group containing at least one atom selected from oxygen, nitrogen, sulfur, phosphorus, and silicon atoms or an atomic group selected from the group consisting of an amino group, an ammonium group, and a mercapto group; and n represents a natural number of from 1 to 4.

(3) The positive photoresist composition as described in (1) or (2) above, wherein W in formula (I) for component (a) is a group selected from the group consisting of the following substituents:

W:

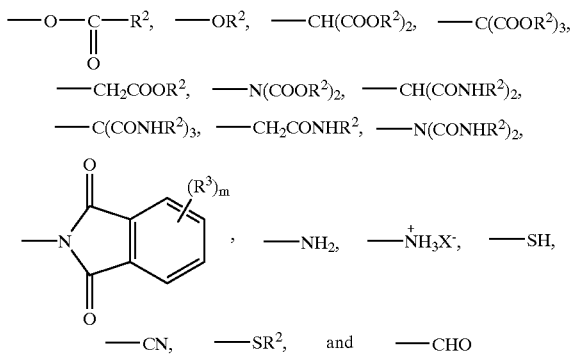

wherein
$R^2$ represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group, and a substituted or unsubstituted aralkyl group;

$R^3$ represents a hydrogen atom or a substituent selected from the group consisting of a linear, branched, or cyclic alkyl group having 1 to 6 carbon atoms, a linear, branched, or cyclic alkoxy group having 1 to 6 carbon atoms, a halogen atom, a nitro group, an amino group, a hydroxyl group, and a cyano group;

X represents a halogen atom; and m represents a natural number of from 1 to 4.

(4) The positive photoresist composition as described in (1), (2) or (3), wherein the alkali-soluble resin containing phenolic hydroxyl groups used for Resin A and/or Resin B is poly(p-hydroxystyrene).

DETAILED DESCRIPTION OF THE INVENTION

The present invention will be explained below in detail.

The alkali-soluble resin having phenolic hydroxyl groups used for the present invention is preferably a copolymer of o-, m-, or p-hydroxystyrene (these are inclusively referred to as hydroxystyrenes) or o-, m-, or p-hydroxy-α-methylstyrene (these are inclusively referred to as hydroxy-α-methylstyrenes) in which the content of repeating units derived from the styrene derivative is at least 30 mol %, preferably at least 50 mol %, a homopolymer of any of these styrene derivatives, or a resin obtained by partially hydrogenating the benzene nuclei of those units of the copolymer or homopolymer. More preferred is a homopolymer of p-hydroxystyrene. Preferred examples of monomers used for copolymerization in producing the above copolymer, besides the hydroxystyrenes and the hydroxy-α-methylstyrenes, include acrylic esters, methacrylic esters, acrylamide and analogues thereof, methacrylamide and analogues thereof, acrylonitrile, methacrylonitrile, maleic anhydride, styrene, α-methylstyrene, acetoxystyrene, and alkoxystyrenes. More preferred are styrene, acetoxystyrene, and t-butoxystyrene.

This alkali-soluble resin has a weight-average molecular weight in the range of preferably from 3,000 to 80,000, more preferably from 7,000 to 50,000. The molecular weight distribution ($M_w/M_n$) thereof is in the range of generally from 1.01 to 4.0, preferably from 1.05 to 1.20. A polymerization technique such as anionic polymerization is preferably used for obtaining a polymer having such a molecular weight distribution.

In the present invention, it is essential to use Resin A obtained from the alkali-soluble resin containing phenolic hydroxyl groups by replacing from 10 to 80% of the phenolic hydroxyl groups each with a group represented by formula (I) given above.

In formula (I), $R^1$ represents a substituent selected from alkyl groups having 1 to 4 carbon atoms.

W represents either an organic group containing at least one atom selected from oxygen, nitrogen, sulfur, phosphorus, and silicon atoms or an atomic group selected from the group consisting of an amino group, an ammonium group, and a mercapto group.

Furthermore, n represents a natural number of from 1 to 4, preferably 2 or 3.

Preferred examples of $R^1$ include methyl, ethyl, n-propyl, isopropyl, n-butyl, isobutyl, sec-butyl, and t-butyl. More preferred is methyl.

The organic group represented by W comprises at least one atom selected from oxygen, nitrogen, sulfur, phosphorus, and silicon atoms and at least one carbon atom.

Preferred examples of W include groups represented by the following formulae.

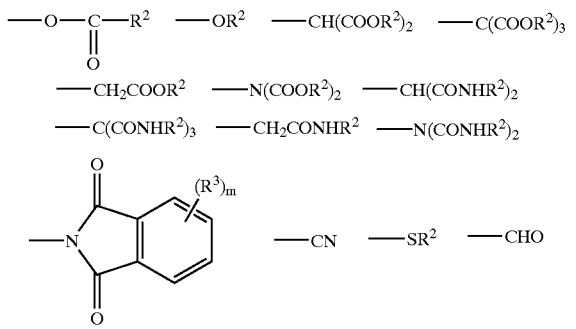

In the above formulae, $R^2$ represents or $R^2$'s each independently represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group having 6 to 12 carbon atoms, and a substituted or unsubstituted aralkyl group having 7 to 13 carbon atoms;

$R^3$ represents or $R^3$'s each independently represents a hydrogen atom or a substituent selected from the group consisting of a linear, branched, or cyclic alkyl group having 1 to 6 carbon atoms, a linear, branched, or cyclic alkoxy group having 1 to 6 carbon atoms, a halogen atom, a nitro group, an amino group, a hydroxyl group, and a cyano group;

X represents a halogen atom; and m represents a natural number of from 1 to 4, preferably 1 or 2.

Preferred examples of the linear, branched, or cyclic alkyl group having 1 to 6 carbon atoms which is represented by $R^2$ or $R^3$ include methyl, ethyl, n-propyl, isopropyl, cyclopropyl, n-butyl, isobutyl, sec-butyl, t-butyl, pentyl, isopentyl, neopentyl, cyclopentyl, hexyl, and cyclohexyl. More preferred are methyl and ethyl.

Preferred examples of the linear, branched, or cyclic alkenyl group having 2 to 6 carbon atoms which is represented by $R^2$ include vinyl, 1-propenyl, allyl, isopropenyl, 1-butenyl, 2-butenyl, 2-pentenyl, and cyclohexenyl. More preferred are vinyl and isopropenyl.

Preferred examples of the aryl group having 6 to 12 carbon atoms include phenyl, tolyl, xylyl, mesityl, and cumenyl, with phenyl being more preferred. Preferred examples of the aralkyl group having 7 to 13 carbon atoms include benzyl, phenethyl, α-methylbenzyl, and benzhydryl, with benzyl being more preferred.

These aryl and aralkyl groups may have one or more substituents selected from halogen atoms, nitro, alkoxy, acetyl, amino, ester, and amido groups, and the like.

Preferred examples of the linear, branched, or cyclic alkoxy group having 1 to 6 carbon atoms which is represented by $R^3$ include methoxy, ethoxy, propoxy, isopropoxy, butoxy, pentyloxy, and hexyloxy. More preferred are methoxy and ethoxy.

Preferred examples of the halogen atom include fluorine, chlorine, bromine, and iodine. More preferred are chlorine and bromine.

As shown above, W may be a cyano or formyl group.

Specific examples of formula (I) are given below. However, formula (I) should not be construed as being limited to these examples, in which Me, Et, and Ph represent methyl, ethyl, and phenyl, respectively.

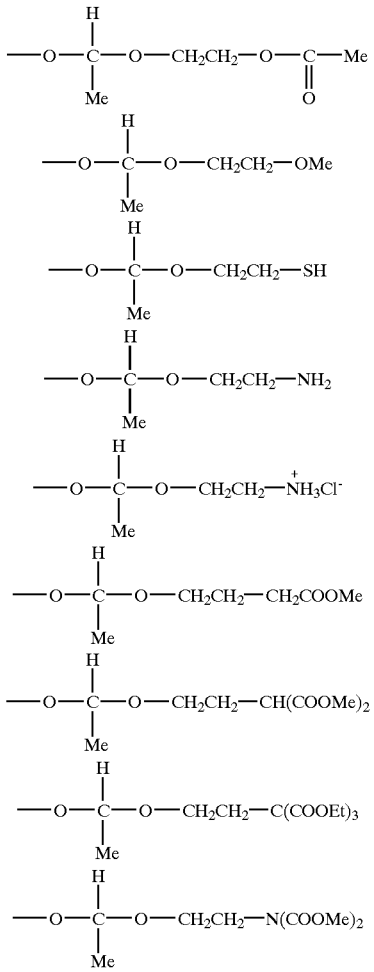

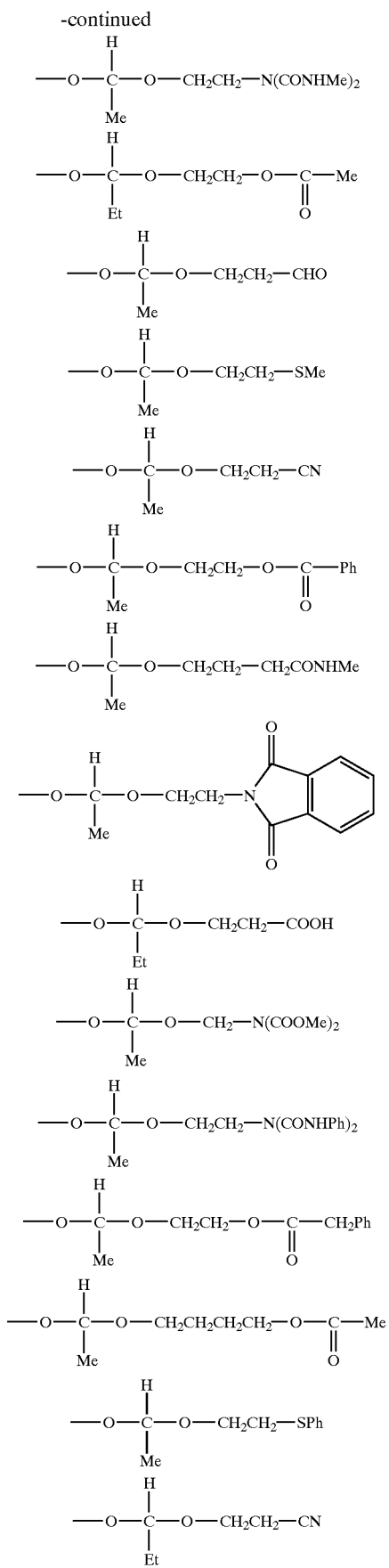

Resin A, having the substituents described above, can be obtained by synthesizing the vinyl ether corresponding to the substituents and reacting the ether by a known method with an alkali-soluble resin containing phenolic hydroxyl groups which has been dissolved in an appropriate solvent, e.g., tetrahydrofuran. This reaction is usually conducted in the presence of an acid catalyst, preferably an acid ion-exchange resin, hydrochloric acid, or p-toluenesulfonic acid, or a salt such as pyridinium tosylate. The corresponding vinyl ether can be synthesized from an active starting material such as chloroethyl vinyl ether through a nucleophilic substitution reaction or the like.

Specific examples of the structure of Resin A are shown below. However, Resin A for use in the present invention should not be construed as being limited to these examples, in which Me represents methyl, Et ethyl, Ph phenyl, tBu t-butyl, and Ac acetyl.

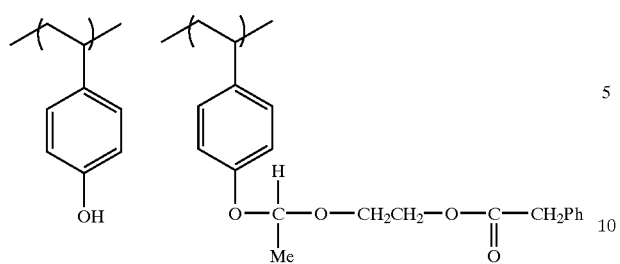
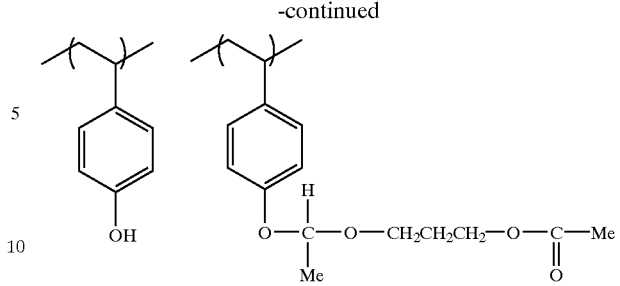
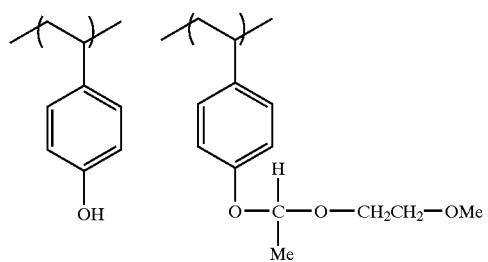
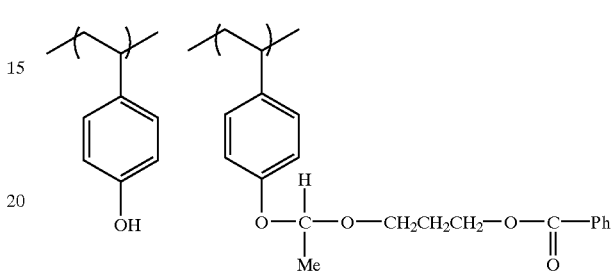
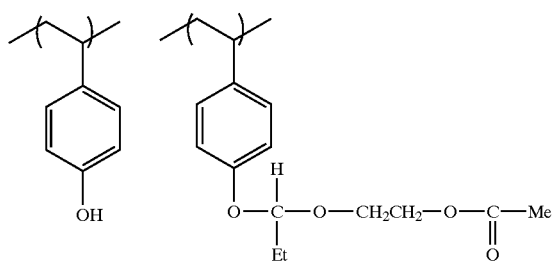
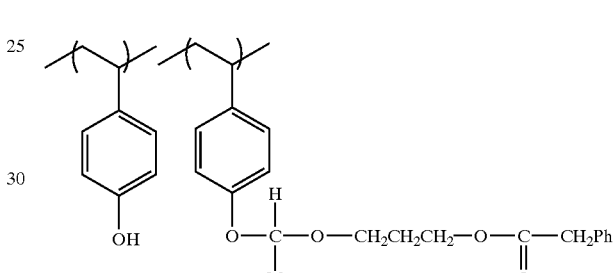
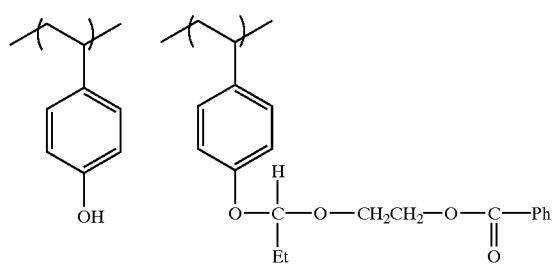
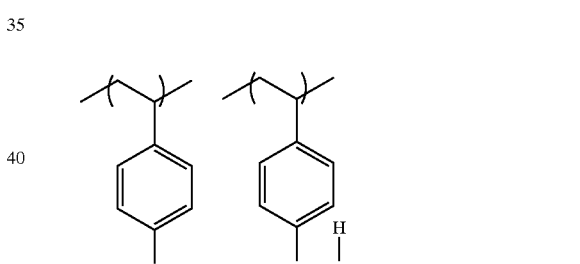
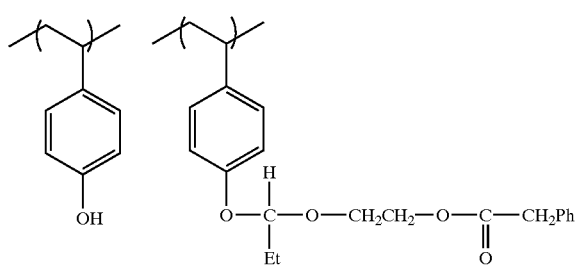
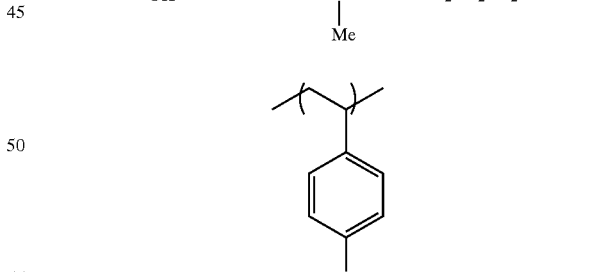
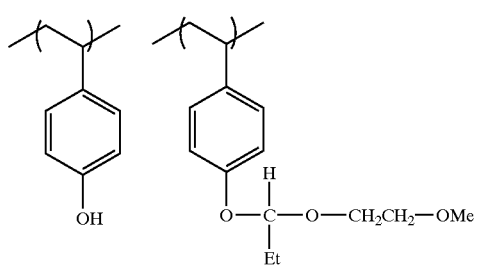
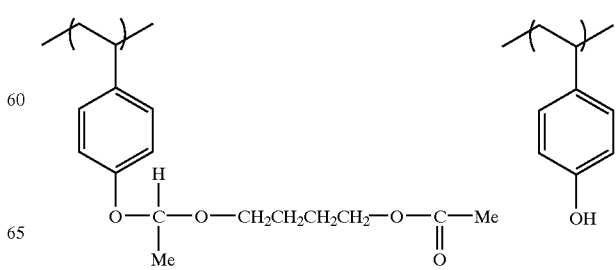

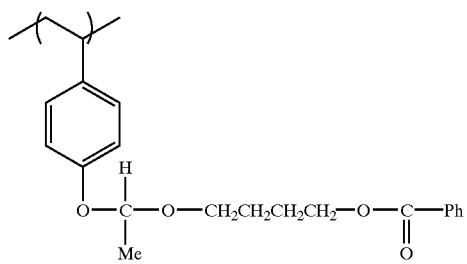 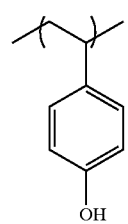
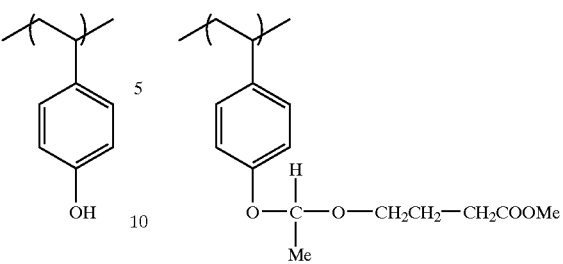 
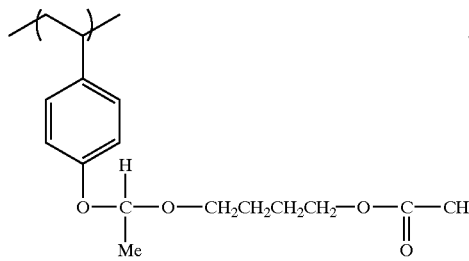 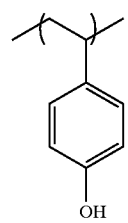
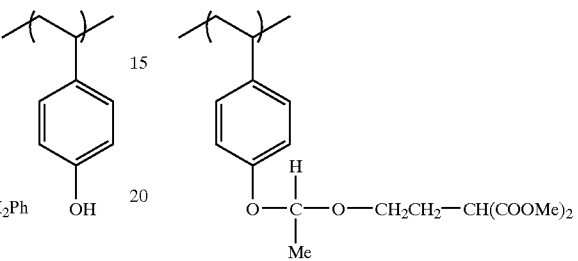
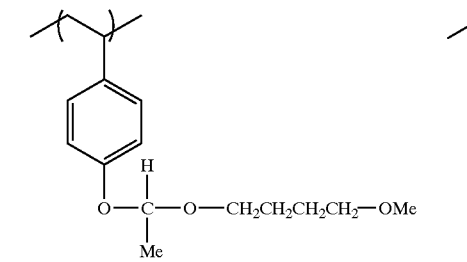 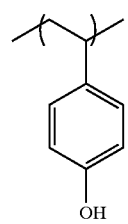
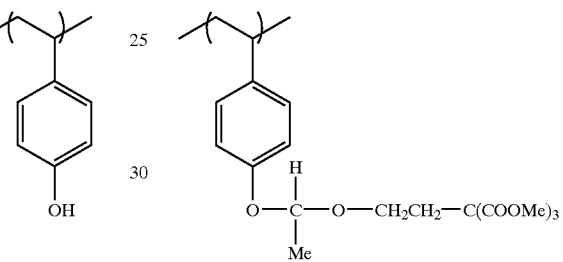
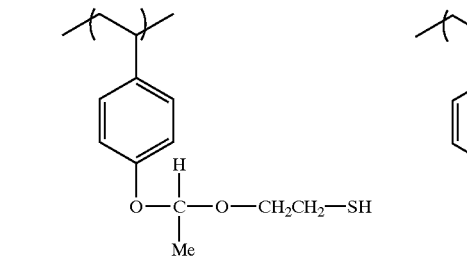 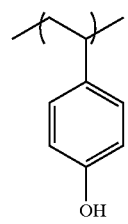
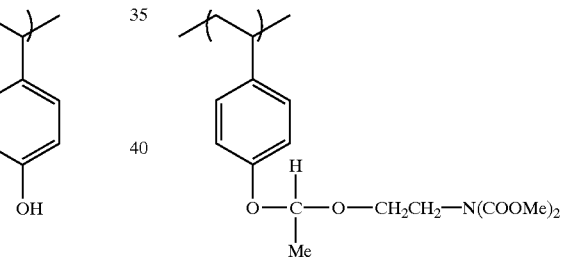
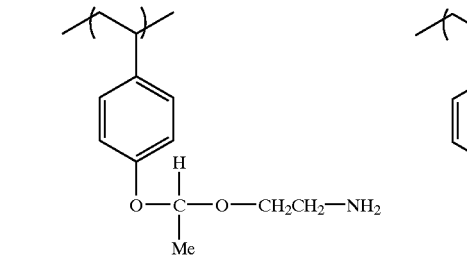 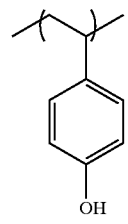
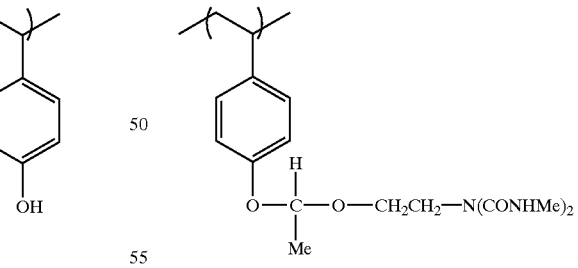
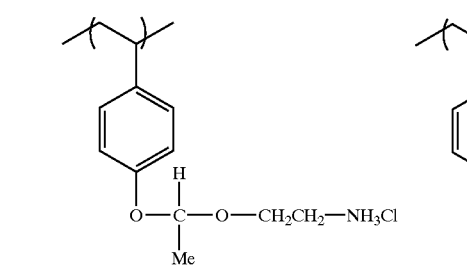 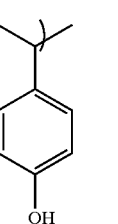
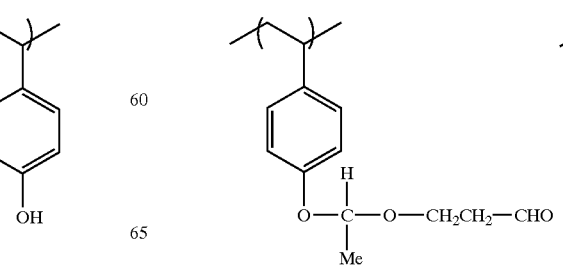

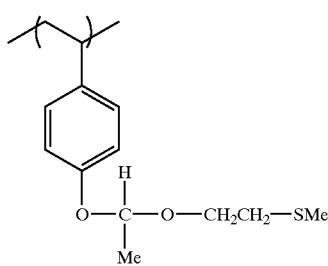 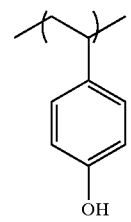 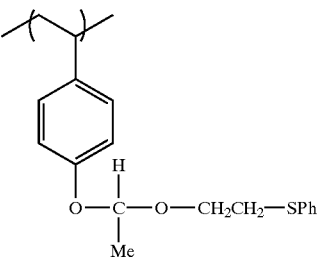 
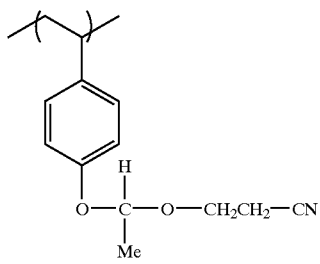 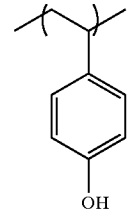 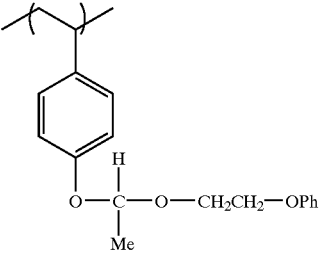 
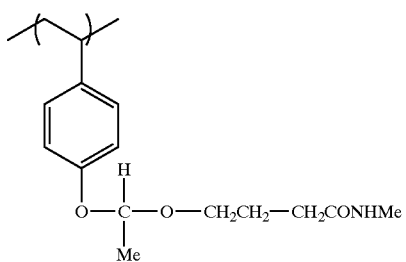 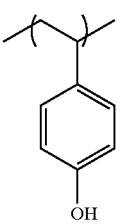 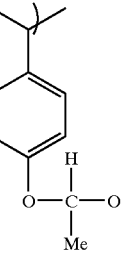 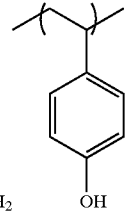 
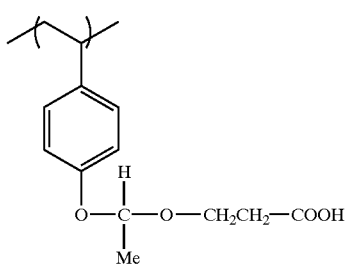 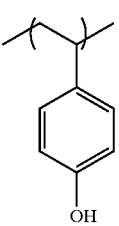 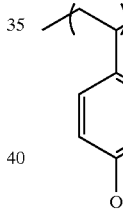 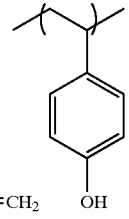 
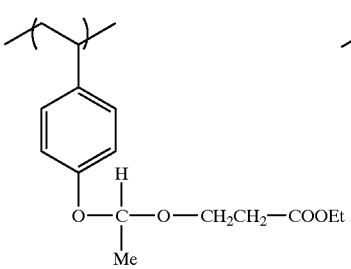 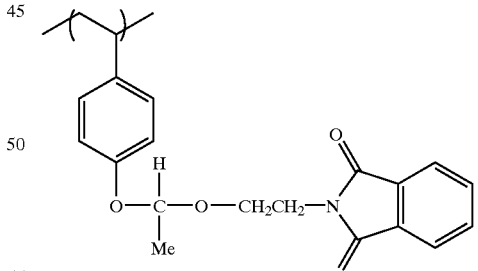 
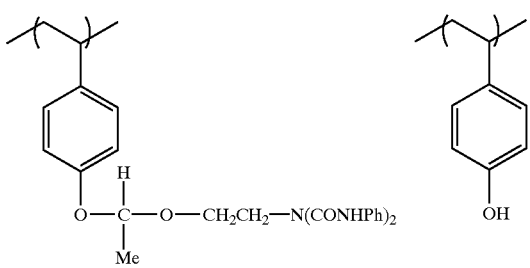 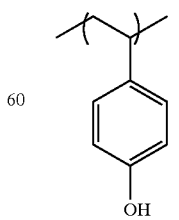 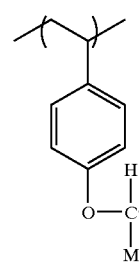

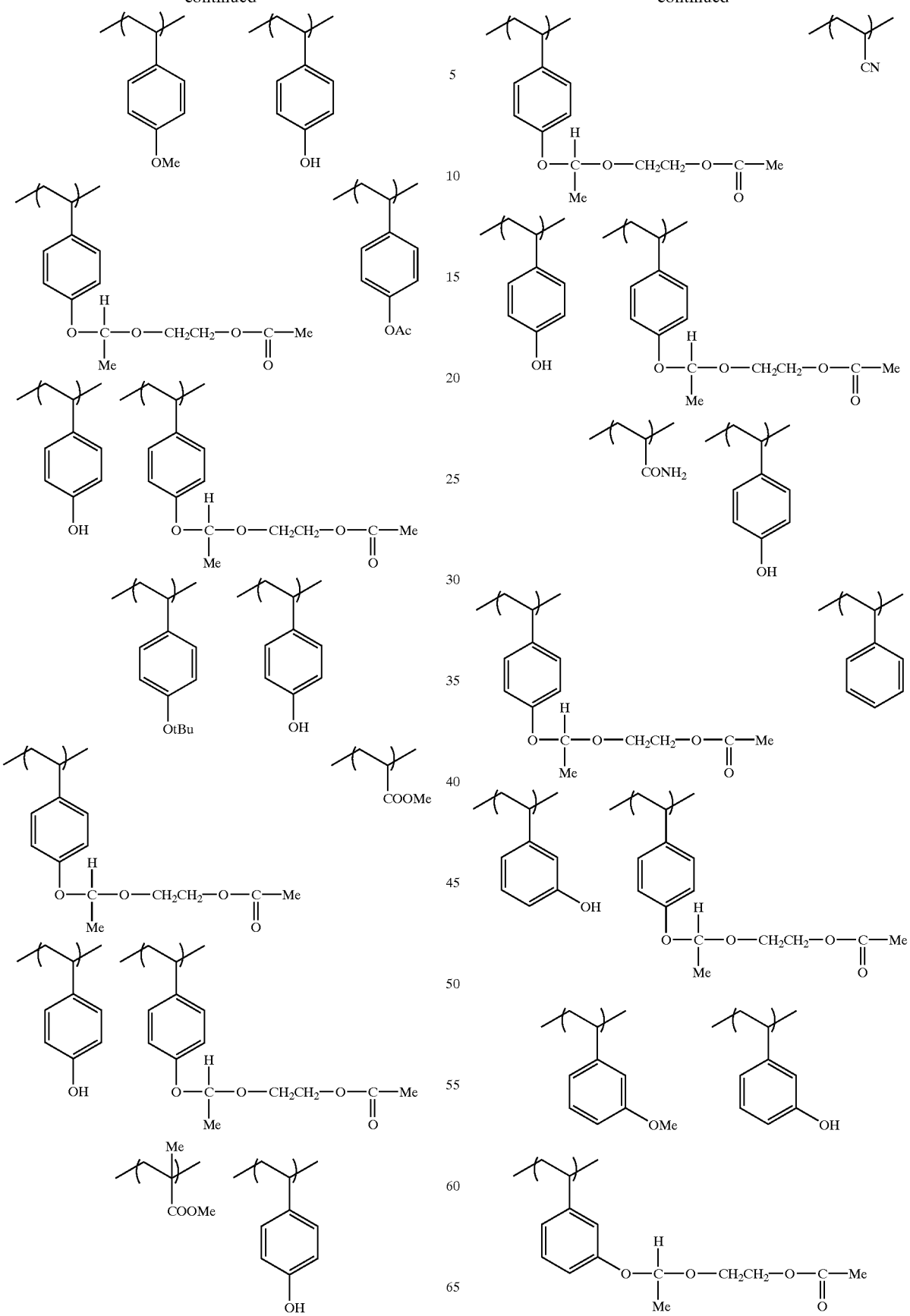

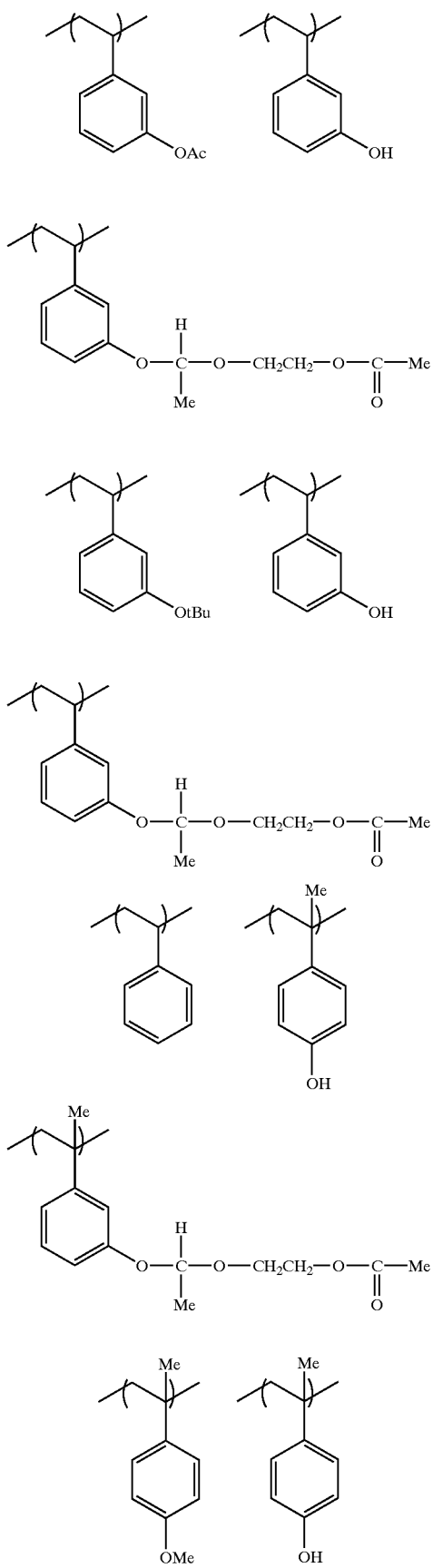
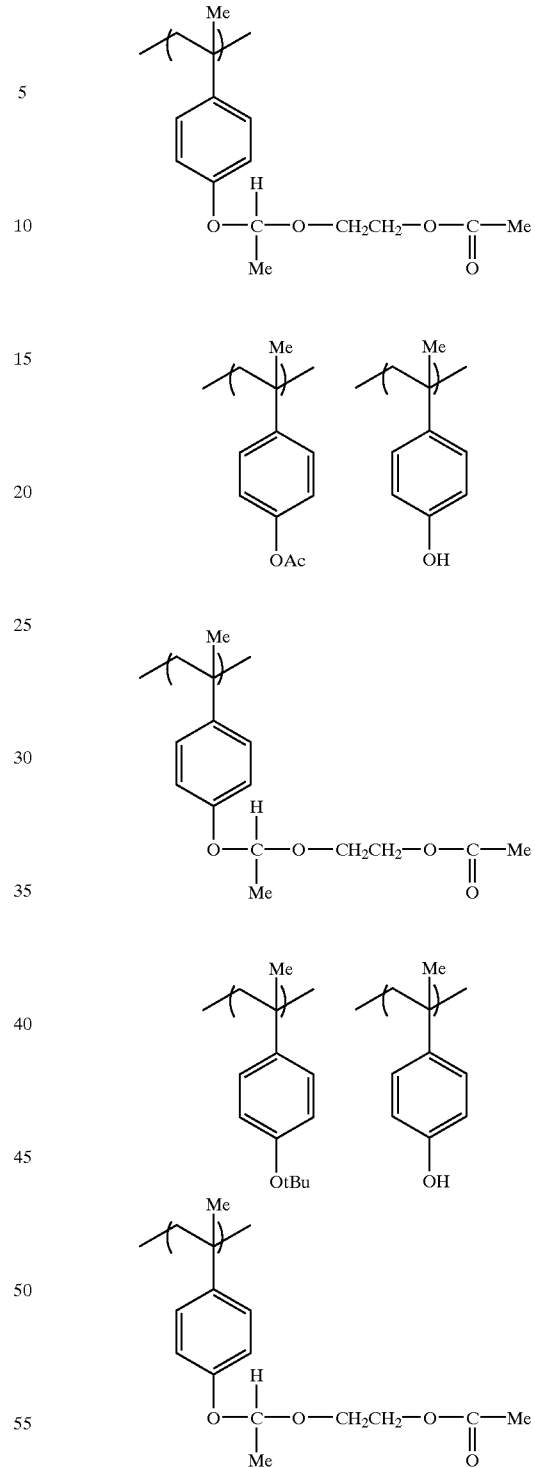

In Resin B according to the present invention, the substituent $R^4$ in formula (II) or (III) given above is an alkyl group having 1 to 6 carbon atoms, specifically, a linear, branched, or cyclic alkyl group having 1 to 6 carbon atoms. Examples thereof include methyl, ethyl, n-propyl, isopropyl, n-butyl, isobutyl, sec-butyl, t-butyl, n-pentyl, isopentyl, neopentyl, t-pentyl, cyclopentyl, n-hexyl, isohexyl, and cyclohexyl. Preferred among these are tertiary alkyl groups such as t-butyl and t-pentyl.

Specific examples of the structure of Resin B are shown below. However, Resin B for use in the present invention should not be construed as being limited to these examples, in which Me represents methyl, Et ethyl, Ph phenyl, tBu t-butyl, and Ac acetyl.

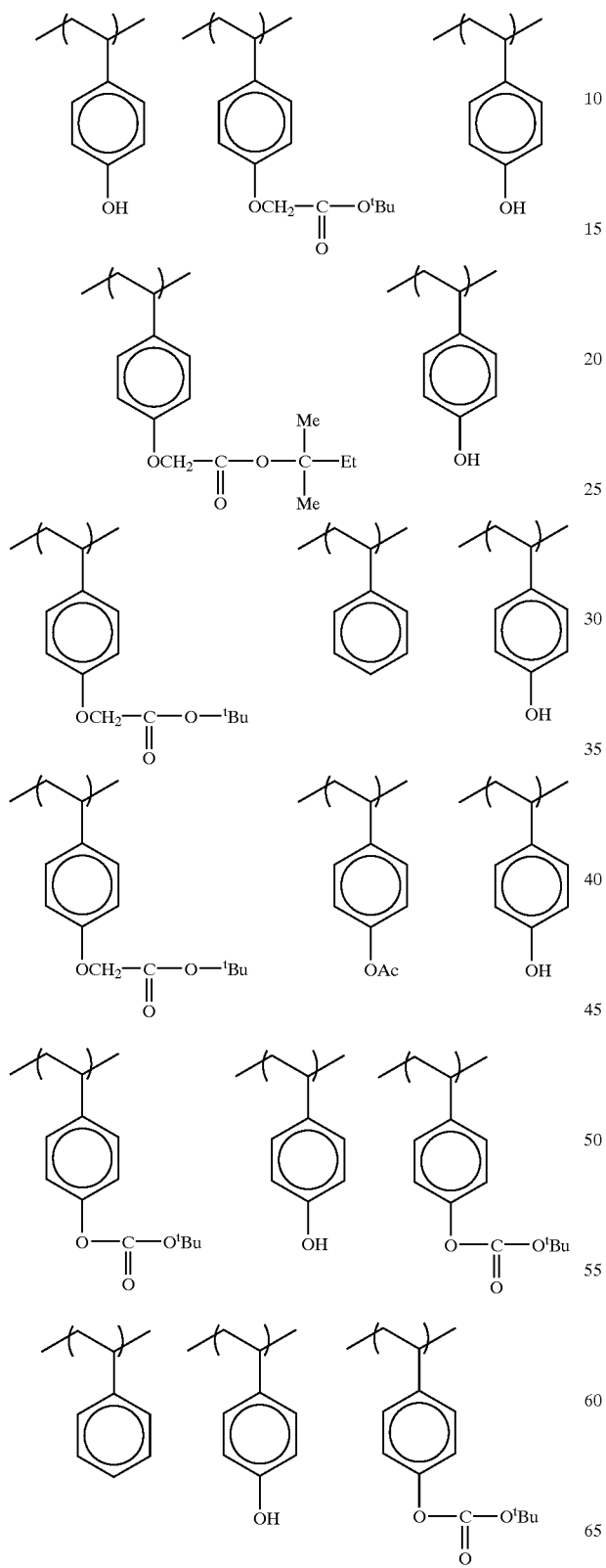

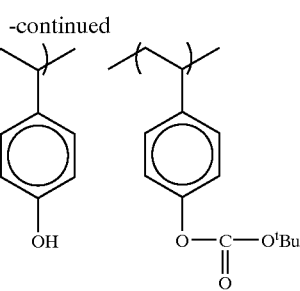

In Resin A contained in the first composition according to the present invention, from 10 to 80%, preferably from 15 to 60%, more preferably from 20 to 40%, of the phenolic hydroxyl groups of the alkali-soluble resin should have been replaced with substituents represented by formula (I).

If the degree of replacement of the phenolic hydroxyl groups with substituents represented by formula (I) is lower than 10%, a sufficient difference in the rate of dissolution in alkali cannot be obtained between exposed and unexposed areas, resulting in reduced resolution. If the degree of that replacement exceeds 80%, especially heat resistance decreases. Thus, such too high and too low degrees of replacement are unsuitable for the present invention.

Like Resin A, Resin B according to the present invention should be one in which 10 to 80%, preferably from 15 to 60%, more preferably from 20 to 40%, of the phenolic hydroxyl groups of the alkali-soluble resin have been replaced with substituents represented by formula (II) or (III).

If the degree of replacement of the phenolic hydroxyl groups with substituents represented by formula (II) or (III) is lower than 10%, a sufficient difference in the rate of dissolution in alkali cannot be obtained between exposed and unexposed areas, resulting in reduced resolution. If the degree of that replacement exceeds 80%, especially heat resistance decreases. Thus, such too high and too low degrees of replacement are unsuitable for the present invention.

Resin B in the present invention may contain both or either of substituents represented by formula (II) and substituents represented by formula (III).

Resin A according to the present invention, which is obtained by protecting phenolic hydroxyl groups (alkali-soluble groups) of an alkali-soluble resin with specific acid-decomposable groups represented by formula (I), produces remarkable effects when used in combination with Resin B, which has been protected with specific acid-decomposable groups represented by formula (II) or (III).

Resin B can be synthesized by the following methods. In the case where substituents represented by formula (II) are introduced into an alkali-soluble resin containing phenolic hydroxyl groups, this is accomplished by reacting the alkali-soluble resin with, for example, t-butyl bromoacetate by a known method to replace part of the phenolic hydroxyl groups with t-butyl ester groups, thereby giving Resin B. In the case where substituents represented by formula (III) are introduced into the alkali-soluble resin, this is accomplished by reacting the alkali-soluble resin with, for example, di-t-butyl dicarbonate by a known method to replace part of the phenolic hydroxyl groups with t-butoxycarbonyloxy groups, thereby giving Resin B.

In the present invention, Resin A and Resin B each has a weight-average molecular weight of preferably from 3,000 to 80,000, more preferably from 7,000 to 50,000. The molecular weight distribution ($M_w/M_n$) thereof is in the range of generally from 1.01 to 4.0, preferably from 1.05 to 1.20.

The use of Resin A and Resin B in combination, as in the present invention, is novel. The protective groups represented by formulae (I), (II), and (III) contained in these resins decompose by the action of an acid and thus function to enhance solubility of each resin in an alkaline developing solution.

In the composition of the present invention, the mixing weight ratio of Resin A to Resin B (A/B) is preferably from 20/80 to 80/20, more preferably from 30/70 to 70/30, most preferably from 40/60 to 60/40.

By blending these two resins, each having a specific structure, in a specific mixing ratio, a positive photoresist composition having the desired performances is obtained.

On the other hand, in the second composition according to the present invention, Resin A should be one in which from 10 to 80%, preferably from 10 to 60%, more preferably from 10 to 40%, of the phenolic hydroxyl groups of the alkali-soluble resin should have been replaced with substituents represented by formula (I).

If the degree of replacement of the phenolic hydroxyl groups with substituents represented by formula (I) is lower than 10%, a sufficient difference in the rate of dissolution in alkali cannot be obtained between exposed and unexposed areas, resulting in reduced resolution. If the degree of that replacement exceeds 80%, especially heat resistance decreases. Thus, such too high and too low degrees of replacement are unsuitable for the present invention.

Resin A, which is obtained by protecting phenolic hydroxyl groups (alkali-soluble groups) of an alkali-soluble resin with specific acid-decomposable groups represented by formula (I), produces remarkable effects when used in combination with a nonpolymeric dissolution inhibitive compound.

The second composition according to the present invention should further contain a nonpolymeric dissolution inhibitive compound which has at least one kind of group selected from tertiary alkyl ester groups and tertiary alkyl carbonate groups and capable of increasing the solubility of the resin in aqueous alkali solutions by the action of an acid.

The nonpolymeric dissolution inhibitive compound means a compound which has a structure formed by incorporating one or more acid-decomposable groups selected from those mentioned above into a compound having a certain molecular weight not higher than 3,000 and having a single structure, and which becomes alkali-soluble by the action of an acid. This nonpolymeric dissolution inhibitive compound preferably has, per molecule, three or more groups decomposable by an acid and becomes alkali-soluble upon decomposition of these groups.

In the present invention, the resin and nonpolymeric dissolution inhibitive compound described above can be used in combination with an alkali-soluble resin containing no acid-decomposable groups.

The nonpolymeric dissolution inhibitive compound, component (b), used in the present invention has at least one kind of acid-decomposable group selected from tertiary alkyl ester groups and tertiary alkyl carbonate groups, and may have these two kinds of groups in combination. It is advantageous to use a compound in which each structure has at least two acid-decomposable groups and the two acid-decomposable groups most apart from each other are separated from each other by at least 10, preferably at least 11, more preferably at least 12 bonding atoms excluding those contained in the acid-decomposable groups, or to use a compound in which each structure has at least three acid-decomposable groups and the two acid-decomposable groups most apart from each other are separated from each other by at least 9, preferably at least 10, more preferably at least 11 bonding atoms excluding those contained in the acid-decomposable groups.

The nonpolymeric dissolution inhibitive compound inhibits the dissolution of the alkali-soluble resin in an alkali, but upon exposure to light it functions to accelerate the dissolution of the resin in an alkali because the protective acid-decomposable groups thereof are eliminated by an acid generated upon exposure. Although dissolution inhibitive compounds having the skeletons of naphthalene, biphenyl, and a diphenylcycloalkane are disclosed in JP-A-63-27829 (the term "JP-A" as used herein means an "unexamined published Japanese patent application") and JP-A-3-198059, these compounds are less effective in inhibiting the dissolution of alkali-soluble resins and are insufficient in profile and resolution.

Preferred examples of the nonpolymeric dissolution inhibitive compound for use in the present invention include a compound obtained from a single-structure compound having a molecular weight of 3,000 or lower and containing three or more alkali-soluble groups per molecule by protecting at least half of the alkali-soluble groups with acid-decomposable groups selected from the aforementioned ones. Use of such a nonpolymeric dissolution inhibitive compound containing alkali-soluble groups remaining unprotected is advantageous in that it has improved solubility in solvents and thus enhances the effects of the invention.

In the present invention, the upper limit of the number of those bonding atoms is preferably 50, more preferably 30.

The nonpolymeric dissolution inhibitive compound for use in the present invention has a significantly improved dissolution inhibitive effect on the alkali-soluble resin when it has three or more, preferably four or more acid-decomposable groups, or when it has two acid-decomposable groups and these acid-decomposable groups are apart from each other at not less than a certain distance.

The distance between acid-decomposable groups in the present invention is expressed in terms of the number of bonding atoms present between the groups, excluding the atoms contained in the groups. For example, in each of compounds (1) and (2) shown below, the distance between acid-decomposable groups is 4 bonding atoms. In compound (3), that distance is 12 bonding atoms.

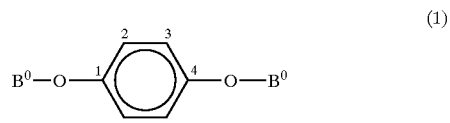

(1)

$$A^0\text{—OOC—}^1CH_2\text{—}^2CH_2\text{—}^3CH_2\text{—}^4CH_2\text{—COO—}A^0 \quad (2)$$

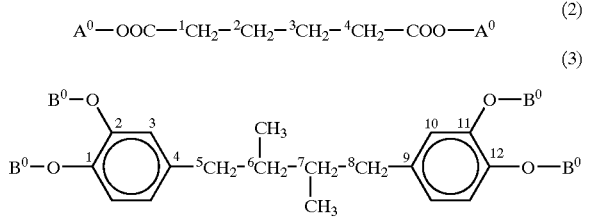

(3)

Acid-decomposable Group: —COO—$A^0$, —O—$B^0$

Although the acid-decomposable dissolution inhibitive compound for use in the present invention may have two or more acid-decomposable groups on the same benzene ring, it is preferably a compound having a framework in which each benzene ring does not have more than one acid-decomposable group. The molecular weight of the acid-decomposable dissolution inhibitive compound for use in the present invention is 3,000 or lower, preferably from 500 to 3,000, more preferably from 1,000 to 2,500.

In a preferred embodiment of the present invention, the acid-decomposable group is bonded to the compound in the form of the structure represented by —COO—C($R^{01}$)($R^{02}$)($R^{03}$) or —O—CO—O—C($R^{01}$)($R^{02}$)($R^{03}$), more preferably the structure represented by —$R^0$—COO—C($R^{01}$)($R^{02}$)($R^{03}$) or —Ar—O—CO—O—C($R^{01}$)($R^{02}$)($R^{03}$).

$R^{01}$, $R^{02}$, and $R^{03}$ may be the same or different and each represents an alkyl group, a cycloalkyl group, an alkenyl group, or an aryl group. Two of $R^{01}$ to $R^{03}$ may be bonded to each other to form a ring, while it is preferred not to form a ring. $R^0$ and Ar represents an optionally substituted, aliphatic or aromatic hydrocarbon group having a valence of 2 or higher.

The alkyl group is preferably one having 1 to 4 carbon atoms, such as methyl, ethyl, propyl, n-butyl, sec-butyl, or t-butyl. The cycloalkyl group is preferably one having 3 to 10 carbon atoms, such as cyclopropyl, cyclobutyl, cyclohexyl, or adamantyl. The alkenyl group is preferably one having 2 to 4 carbon atoms, such as vinyl, propenyl, allyl, or butenyl. The aryl group is preferably one having 6 to 14 carbon atoms, such as phenyl, xylyl, toluyl, cumenyl, naphthyl, or anthracenyl.

Examples of the substituents include hydroxy, halogen atoms (fluorine, chlorine, bromine, and iodine), nitro, cyano, the alkyl groups enumerated above, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the alkenyl groups enumerated above, alkenyloxy groups such as vinyloxy, propenyloxy, allyloxy, and butenyloxy, the aryl groups enumerated above, aryloxy groups such as phenoxy, and aryloxycarbonyl groups such as benzoyloxy.

Examples of the tertiary alkyl group contained in the tertiary alkyl ester groups and tertiary alkyl carbonate groups include t-butyl, t-pentyl and t-hexyl, and especially, t-butyl.

Examples of the nonpolymeric dissolution inhibitive compound as component (b) include compounds obtained from the polyhydroxy compounds given in the patent documents specified below by protecting part or all of the phenolic OH groups by bonding thereto the tertiary alkyl ester groups and tertiary alkyl carbonate groups; the patent documents include JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Applications Nos. 3-33229, 3-230790, 3-320438, 4-25157, 4-52732, 4-103215, 4-104542, 4-107885, 4-107889, and 4-152195.

Preferred of these are the compounds obtained from the polyhydroxy compounds given in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Applications Nos. 4-25157, 4-103215, 4-104542, 4-107885, 4-107889, and 4-152195.

Specifically, such polyhydroxy compounds are represented by formulae (I) to (XVI).

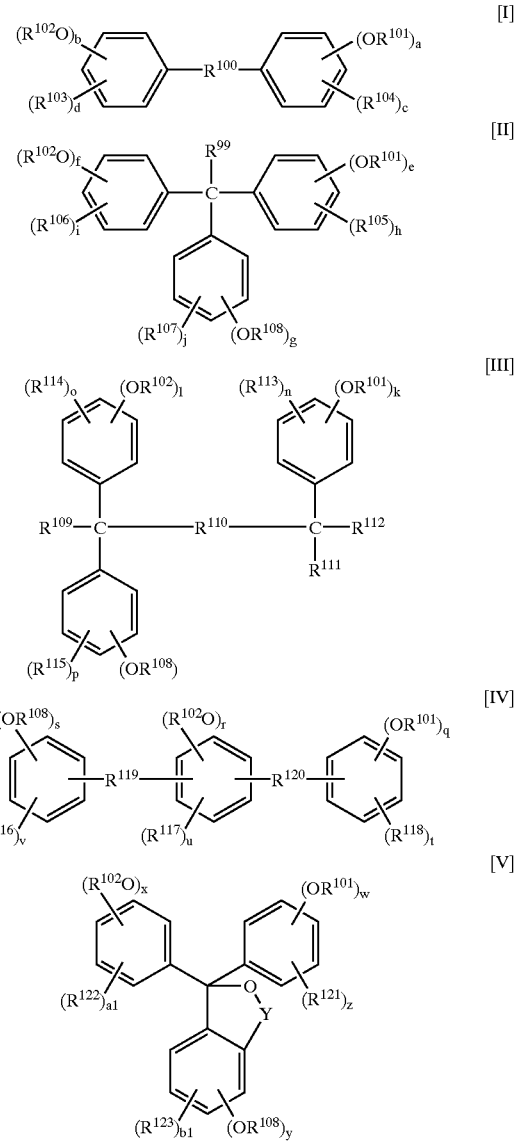

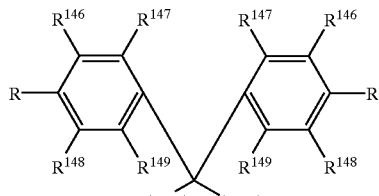

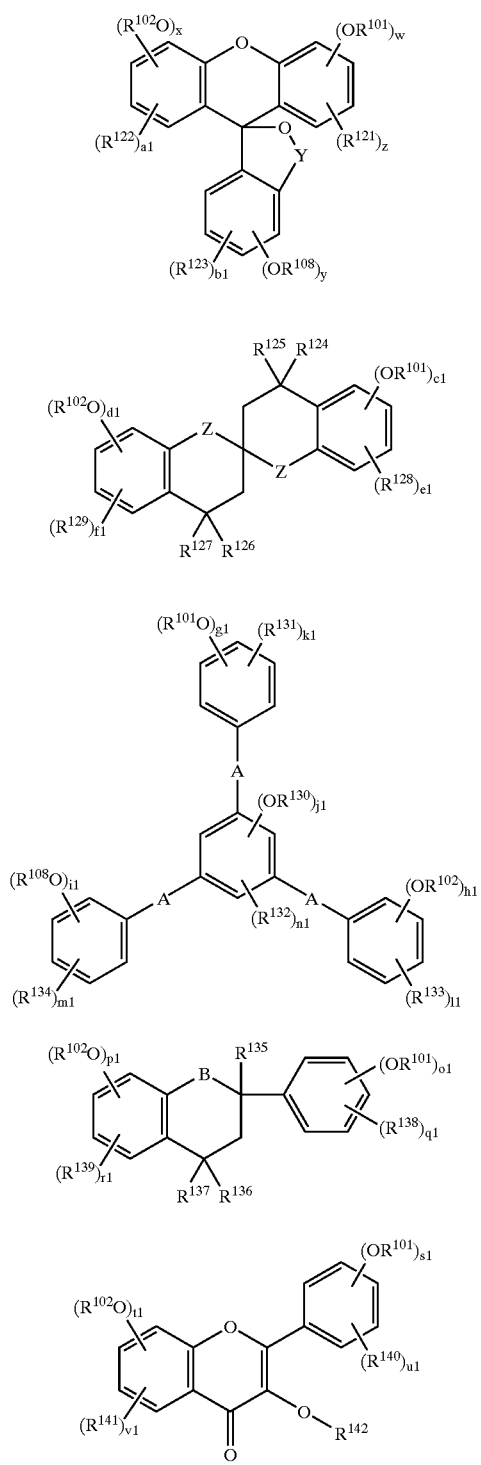

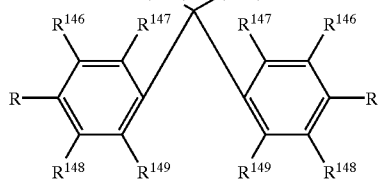

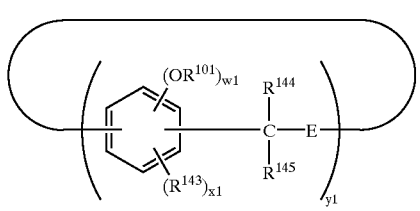

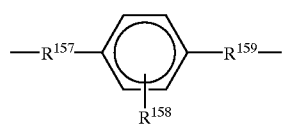

In the above formulae,
$R^{101}$, $R^{102}$, $R^{108}$, and $R^{130}$ may be the same or different and each represents a hydrogen atom, —$R^0$—COO—C($R^{01}$)($R^{02}$)($R^{03}$), or —CO—O—C($R^{01}$)($R^{02}$)($R^{03}$), wherein $R^0$, $R^{01}$, $R^{02}$, and $R^{03}$ have the same meanings as defined hereinabove;

$R^{100}$ represents —CO—, —COO—, —NHCONH—, —NHCOO—, —O—, —S—, —SO—, —SO$_2$—, —SO$_3$—, or a group represented by

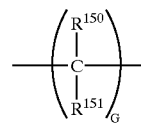

where
G is 2 to 6, provided that when G is 2, at least either of $R^{150}$ and $R^{151}$ is an alkyl group, $R^{150}$ and $R^{151}$ may be the same or different and each represents a hydrogen atom, an alkyl group, an alkoxy group, —OH, —COOH, —CN, a halogen atom, —$R^{152}$—COO$R^{153}$, or —$R^{154}$—OH, $R^{152}$ and $R^{154}$ each represents an alkylene group, and $R^{153}$ represents a hydrogen atom, an alkyl group, an aryl group, or an aralkyl group;

$R^{99}$, $R^{103}$ to $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or —N($R^{155}$)($R^{156}$) (where $R^{155}$ and $R^{156}$ each represents H, an alkyl group, or an aryl group);

$R^{110}$ represents a single bond, an alkylene group, or a group represented by where
$R^{157}$ and $R^{159}$ may be the same or different and each represents a single bond, an alkylene group, —O—, —S—, —CO—, or a carboxyl group, and $R^{158}$ represents a hydrogen atom, an alkyl group, an alkoxy group, an acyl group, an acyloxy group, an aryl group, a nitro group, a hydroxyl group, a cyano group, or a carboxyl group, provided that each hydroxyl group may be replaced by an acid-decomposable group (e.g., t-butoxycarbonylmethyl, tetrahydropyranyl, 1-ethoxy-1-ethyl, or 1-t-butoxy-1-ethyl);

$R^{119}$ and $R^{120}$ may be the same or different and each represents a methylene group, a lower-alkyl-substituted methylene group, a halomethylene group, or a haloalkyl group, provided that the term "lower alkyl" herein means an alkyl group having 1 to 4 carbon atoms;

$R^{124}$ to $R^{127}$ may be the same or different and each represents a hydrogen atom or an alkyl group;

$R^{135}$ to $R^{137}$ may be the same or different and each represents a hydrogen atom, an alkyl group, an alkoxy group, an acyl group, or an acyloxy group;

$R^{142}$ represents a hydrogen atom, —$R^0$—COO—C($R^{01}$)($R^{02}$)($R^{03}$), —CO—O—C($R^{01}$)($R^{02}$)($R^{03}$), or the group represented by

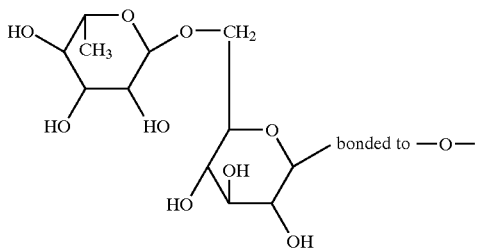

$R^{144}$ and $R^{145}$ may be the same or different and each represents a hydrogen atom, a lower alkyl group, a lower haloalkyl group, or an aryl group;

$R^{146}$ to $R^{149}$ may be the same or different and each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four groups represented by the same symbol need not be the same;

Y represents —CO— or —$SO_2$—;

Z and B each represents a single bond or —O—;

A represents a methylene group, a lower-alkyl-substituted methylene group, a halomethylene group, or a haloalkyl group;

E represents a single bond or an oxymethylene group;

when any of a to z and a1 to y1 is 2 or a larger integer, the groups in the parentheses may be the same or different;

a to q, s, t, v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1 to 4;

j1, n1, z1, a2, b2, c2, and d2 each represents 0 or an integer of 1 to 3;

at least one of z1, a2, c2, and d2 is 1 or larger;

y1 is an integer of 3 to 8;

(a+b), (e+f+g), (k+l+m), (q+r+s), (w+x+y), (c1+d1), (g1+h1+i1+j1), (o1+p1), and (s1+t1) each is 2 or larger;

(j1+n1) is 3 or smaller;

(r+u), (w+z), (x+a1), (y+b1), (c1+e1), (d1+f1), (p1+r1), (t1+v1), and (x1+w1) each is 4 or smaller, provided that in general formula (V), (w+z) and (x+a1) each is 5 or smaller; and (a+c), (b+d), (e+h), (f+i), (g+j), (k+n), (l+o), (m+p), (q+t), (s+v), (g1+k1), (h1+l1), (i1+m1), (o1+q1) and (s1+u1) each is 5 or smaller.

(XIII)

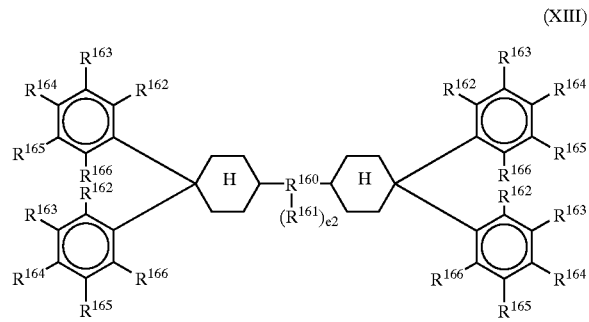

In formula (XIII), $R^{160}$ represents an organic group, a single bond, —S—, —SO—,

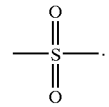

$R^{161}$ represents a hydrogen atom, a monovalent organic group, or a group represented by

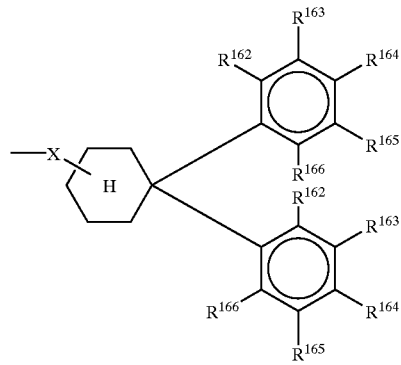

where $R^{162}$ to $R^{166}$ may be the same or different and each represents a hydrogen atom, a hydroxyl group, a halogen atom, an alkyl group, an alkoxy group, an alkenyl group, —O—$R^0$—COO—C($R^{01}$)($R^{02}$)($R^{03}$) or —O—CO—O—C($R^{01}$)($R^{02}$)($R^{03}$), provided that at least two of $R^{162}$ to $R^{166}$ are —O—$R^0$—COO—C($R^{01}$)($R^{02}$)($R^{03}$) or —O—CO—O—C($R^{01}$)($R^{02}$)($R^{03}$), and that the four or six substituents represented by the same symbol need not be the same, and X represents a divalent organic group; and e2 represents 0 or 1.

(XIV)

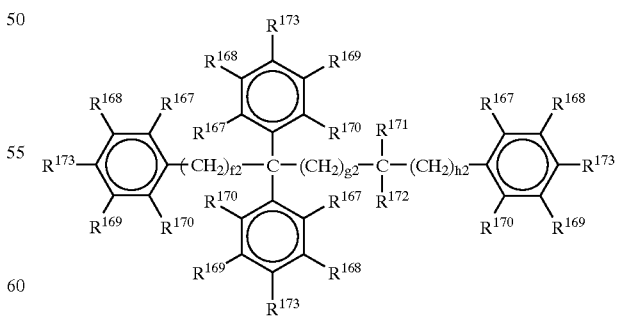

In formula (XIV), $R^{167}$ to $R^{170}$ may be the same or different and each represents a hydrogen atom, a hydroxyl group, a halogen atom, an alkyl group, an alkoxy group, or an alkenyl group, provided that the four to six substituents represented by the same symbol need not be the same;

$R^{171}$ and $R^{172}$ each represents a hydrogen atom, an alkyl group, or a group represented by

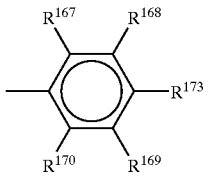

at least two of $R^{173}$'s each represents —O—$R^0$—COO—C($R^{01}$)($R^{02}$)($R^{03}$) or —O—CO—O—C($R^{01}$)($R^{02}$)($R^{03}$), and the remainder each represents a hydroxyl group;
f2 and h2 each represents 0 or 1; and
g2 represents 0 or an integer of 1 to 4.

(XV)

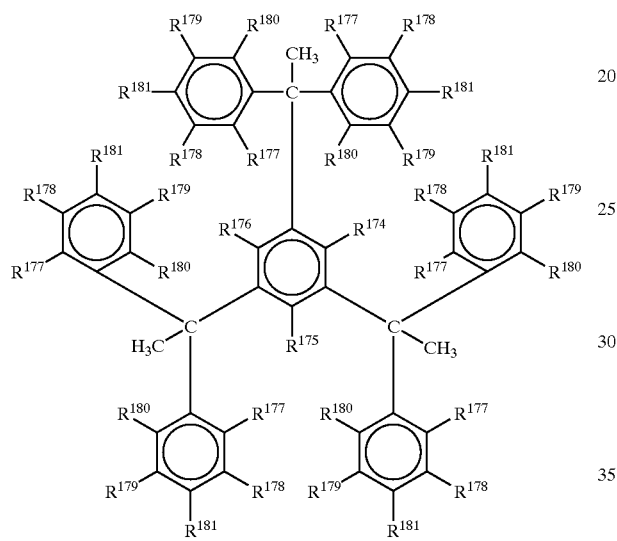

In formula (XV),
$R^{174}$ to $R^{180}$ may be the same or different and each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group, or an aryloxy group, provided that the six substituents represented by the same symbol need not be the same; and
at least two of $R^{181}$'s each represents —O—$R^0$—COO—C($R^{01}$)($R^{02}$)($R^{03}$) or —O—CO—O—C($R^{01}$)($R^{02}$)($R^{03}$) and the remainder each represents a hydroxyl group.

(XVI)

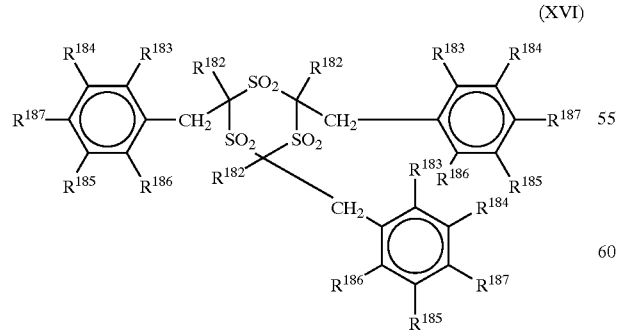

In formula (XVI),
$R^{182}$ represents a hydrogen atom or an alkyl group, provided that the atoms or groups represented by $R^{182}$ need not be the same;

$R^{183}$ to $R^{186}$ each represents a hydroxyl group, a hydrogen atom, a halogen atom, an alkyl group, or an alkoxy group, provided that the three substituents represented by the same symbol need not be the same; and
at least two of $R^{187}$'s each represents —O—$R^0$—COO—C($R^{01}$)($R^{02}$)($R^{03}$) or —O—CO—O—C($R^{01}$)($R^{02}$)($R^{03}$), and the remainder each represents a hydroxyl group.

Specific examples of the frameworks of preferred compounds are shown below.

(1)

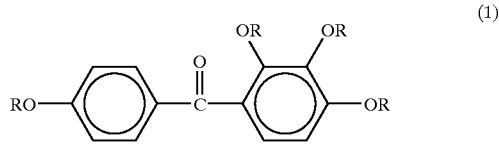

(2)

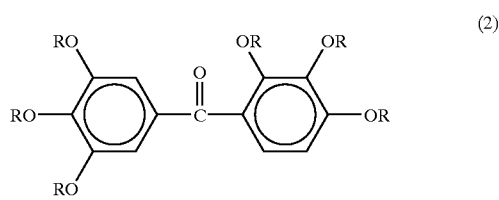

(3)

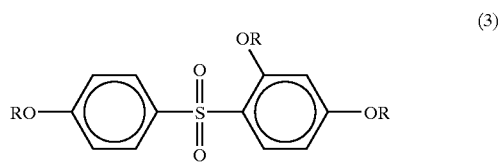

(4)

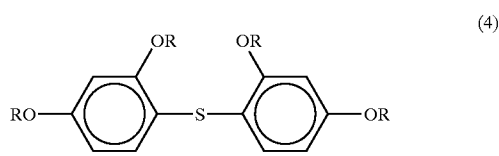

(5)

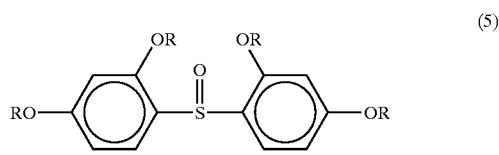

(6)

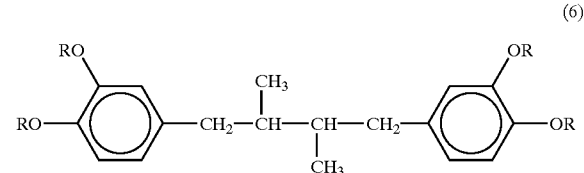

(7)

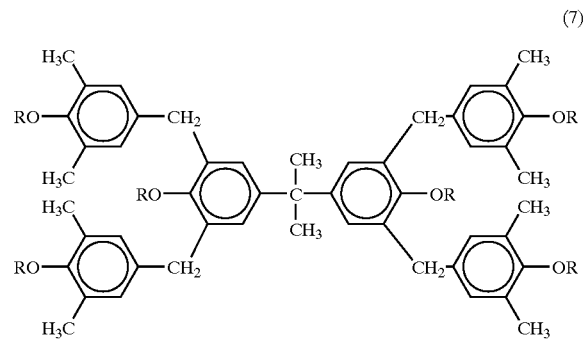

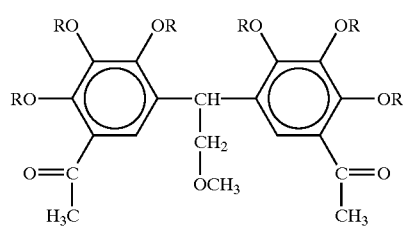
(8)
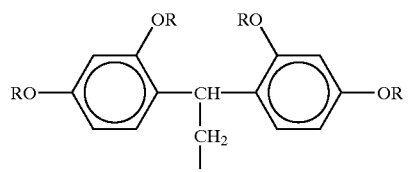
(9)
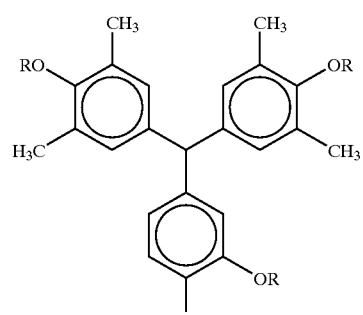
(10)
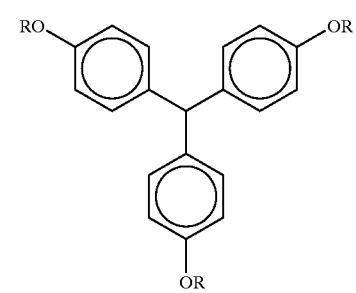
(11)
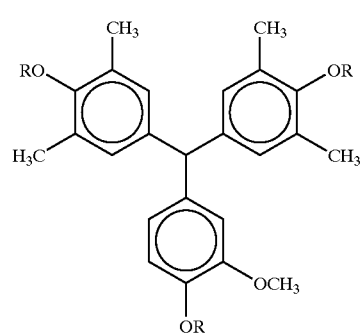
(12)
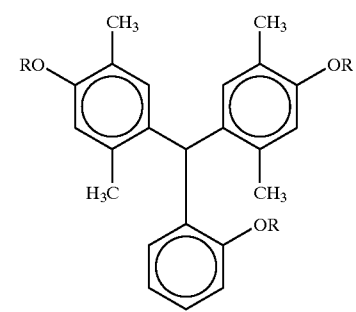
(13)
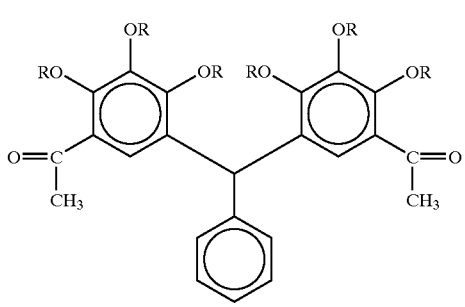
(14)
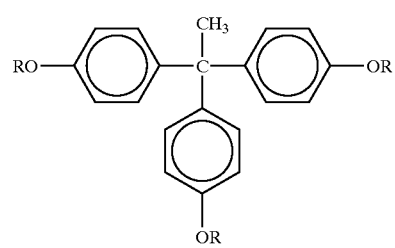
(15)
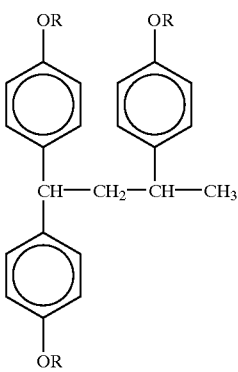
(16)
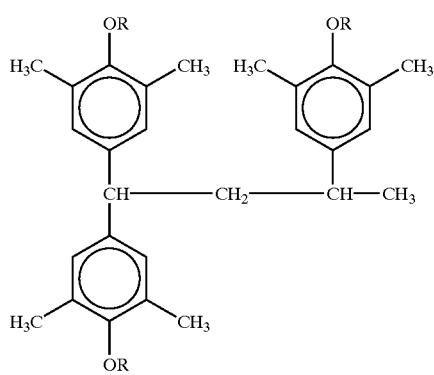
(17)
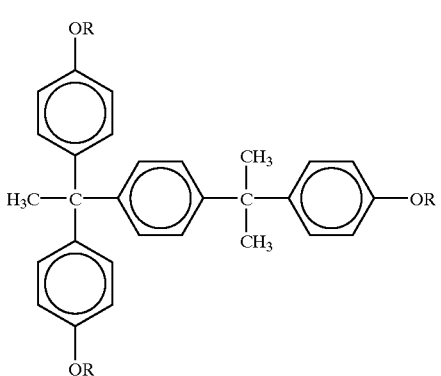
(18)

(19)
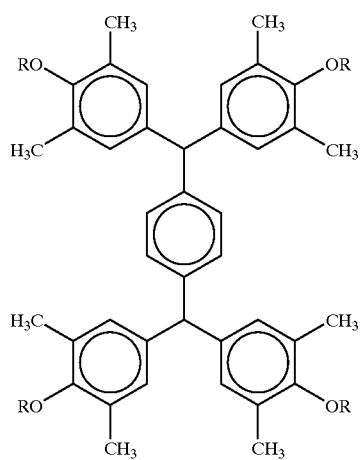
(20)
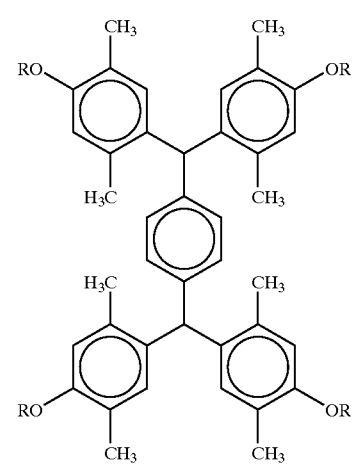
(21)
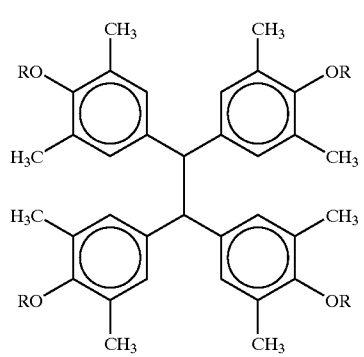
(22)
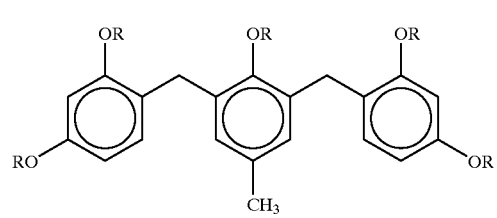
(23)
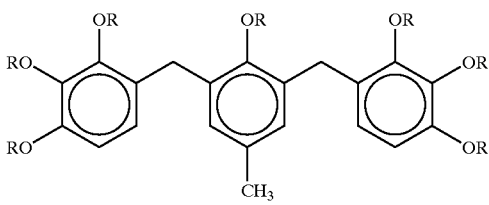
(24)
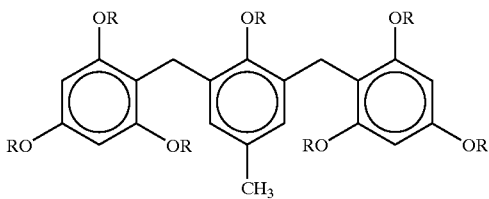
(25)
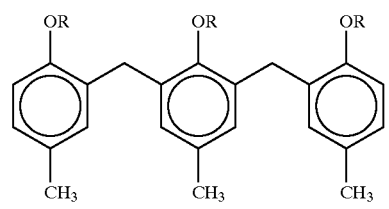
(26)
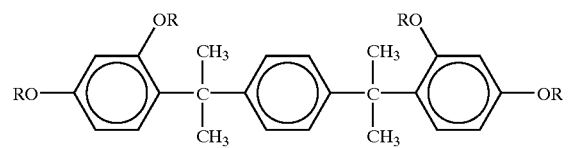
(27)
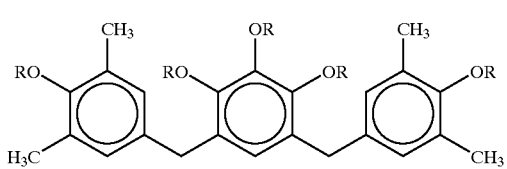
(28)
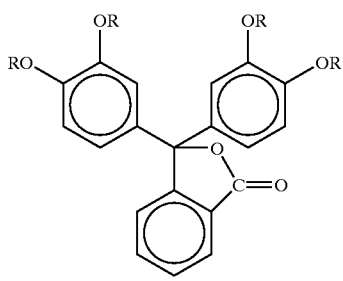
(29)
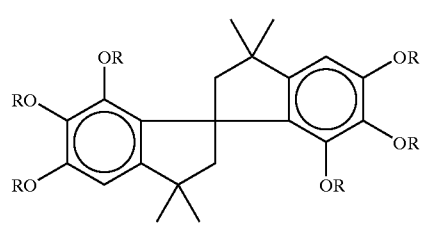

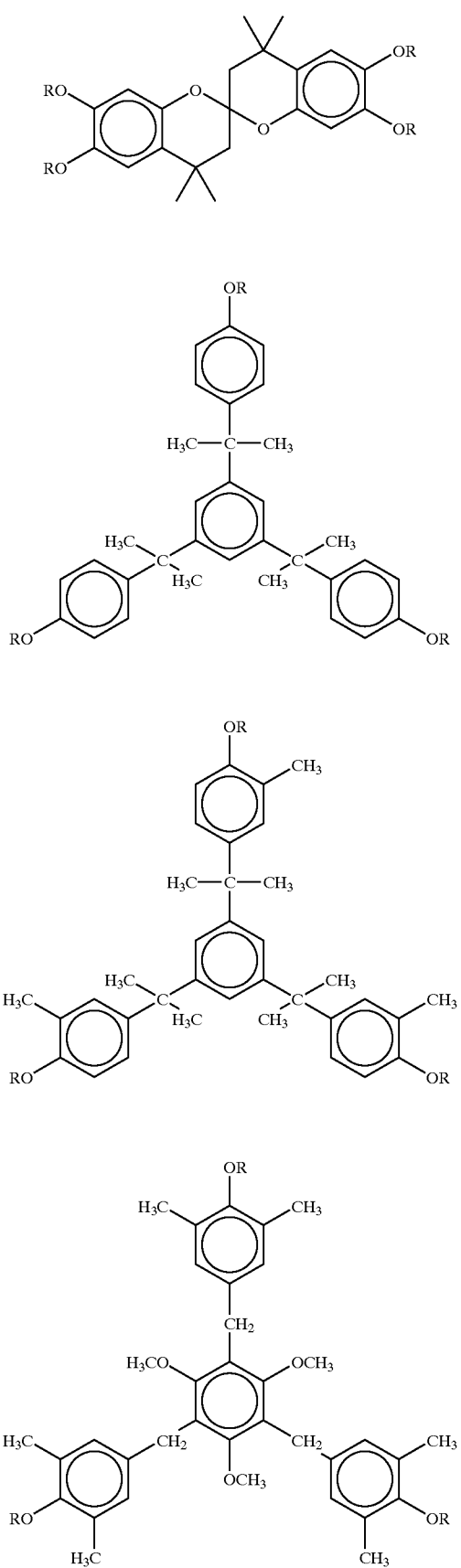
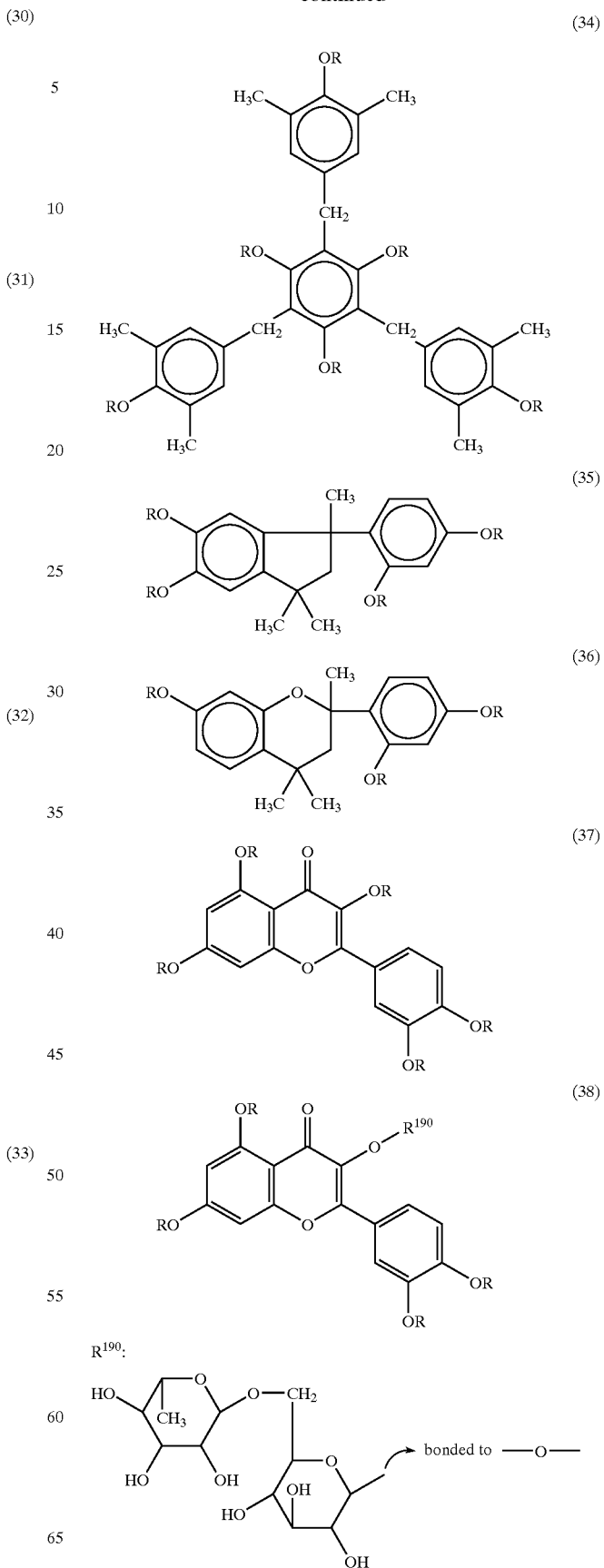

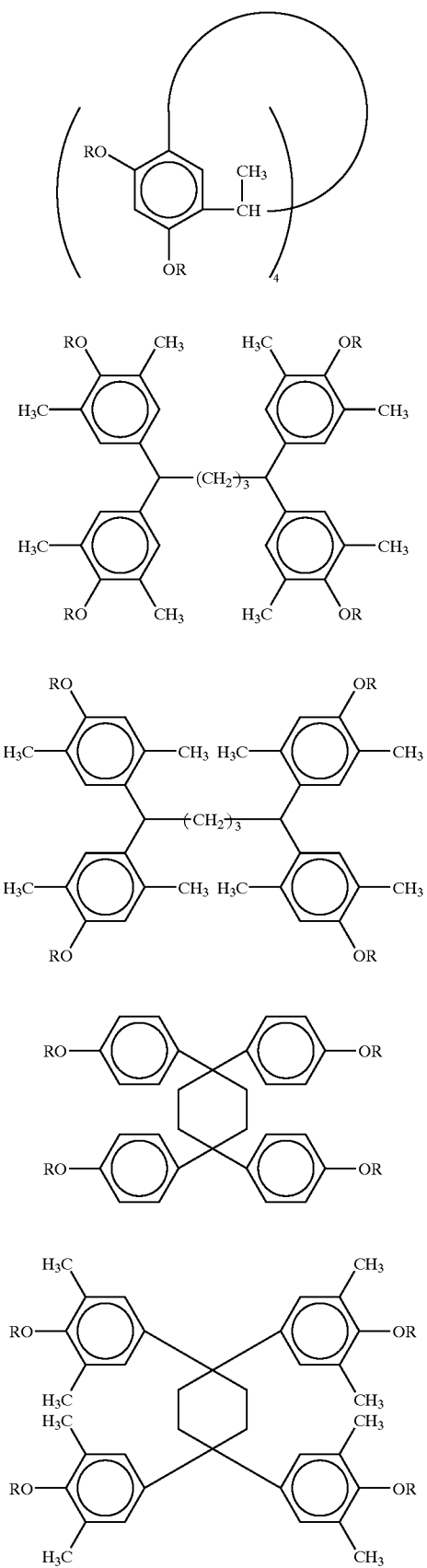
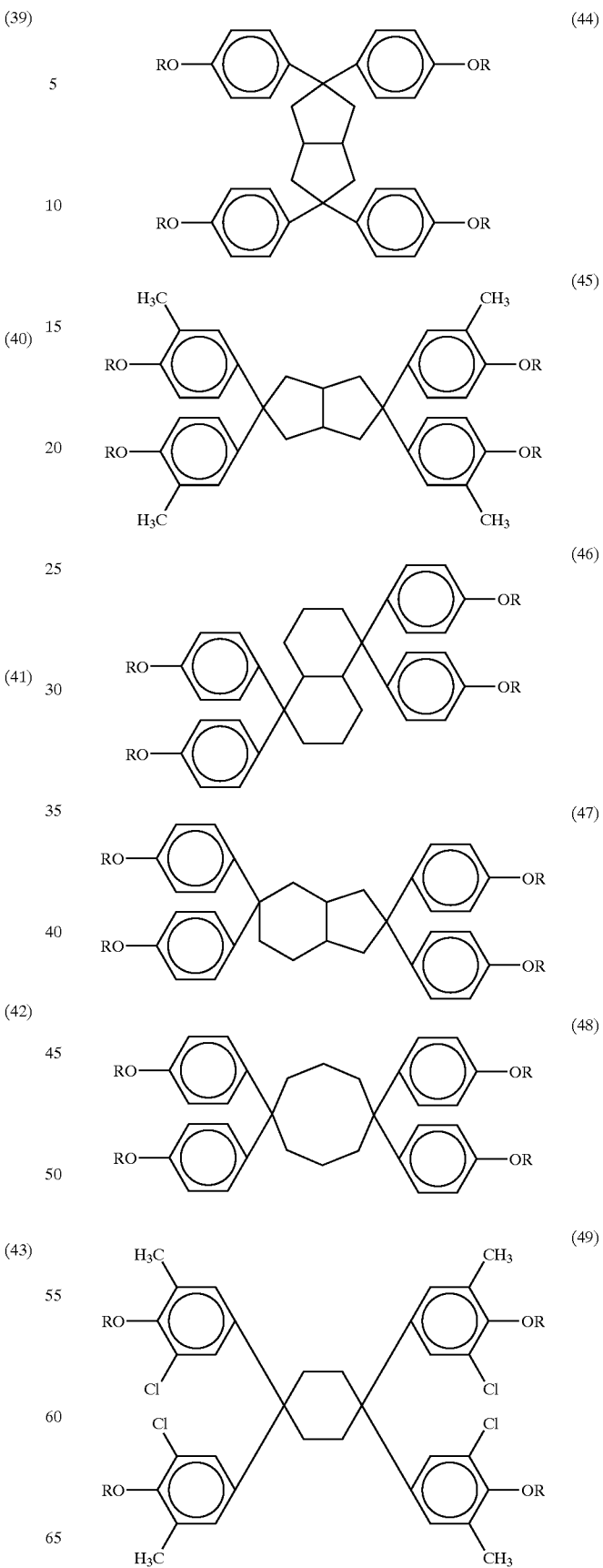

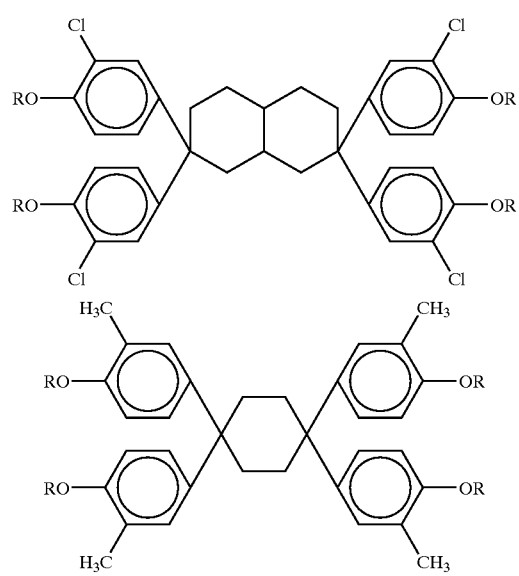
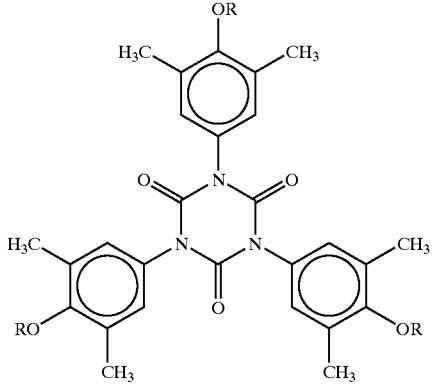
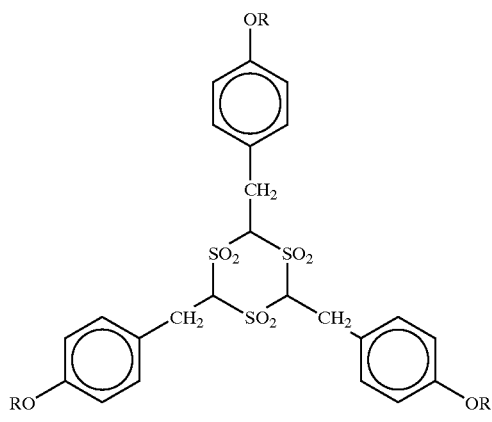
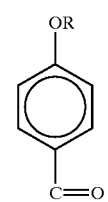

(58)
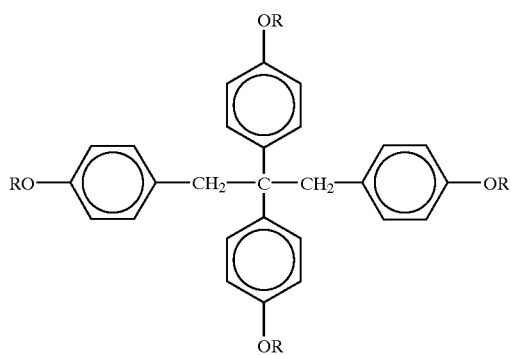

(59)
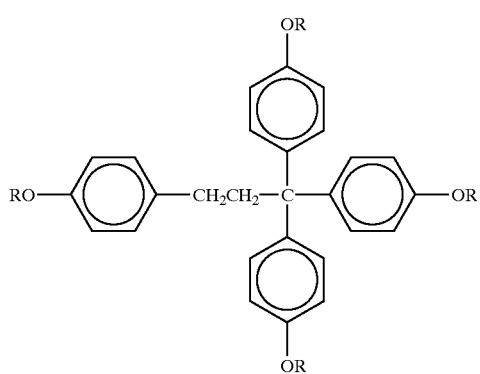

(60)
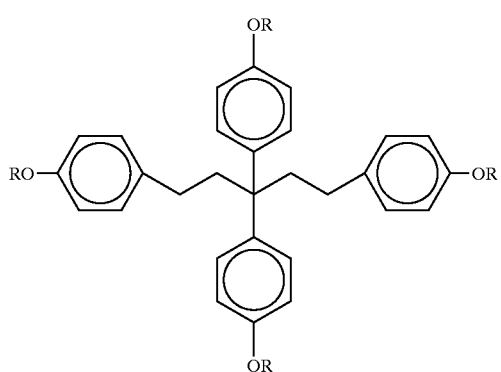

(61)
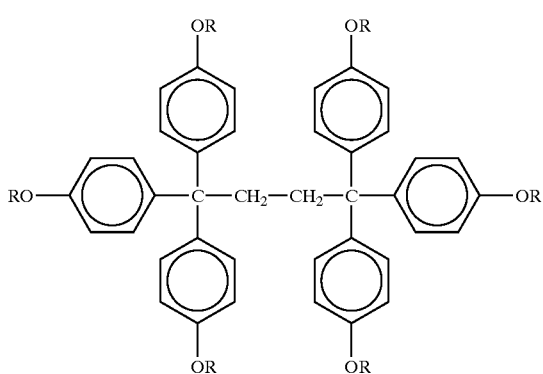

(62)
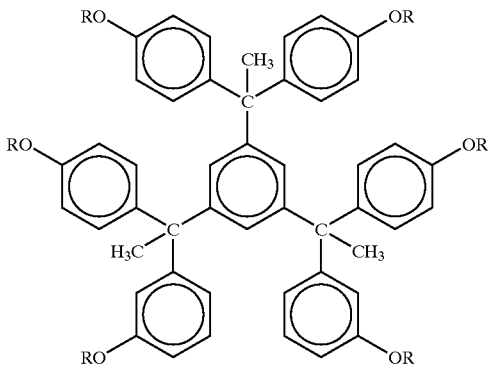

(63)
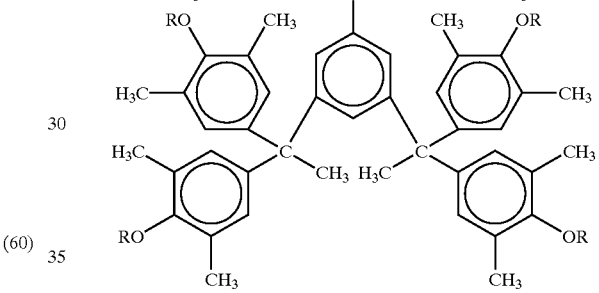

In Compounds (1) to (63), R represents a hydrogen atom, —CH$_2$—COO—C(CH$_3$)$_2$C$_6$H$_5$, —CH$_2$—COO—C(CH$_3$)$_3$, or —COO—C(CH$_3$)$_3$, provided that at least two or, depending on the structure, at least three of R's are not hydrogen atoms, and that the substituents represented by R need not be the same.

In the case where the non-polymer dissolution inhibitive compound described above is used in the present invention, the addition amount of the dissolution inhibitive compound is from 3 to 50% by weight, preferably from 5 to 35% by weight based on the total amount of all solid components of the photosensitive composition. If the amount is less than 3%, high resolution may not be obtained. If it exceeds 50%, there is a tendency that the storage stability is deteriorated to cause film shrinkage and the heat resistance of the resist is deteriorated.

The first and second compositions can contain an alkali-soluble resin having no acid-decomposable groups. The addition of such an alkali-soluble resin improves the sensitivity. The alkali-soluble resin having no acid-decomposable groups (hereinafter referred to also as "alkali-soluble resin") is a resin soluble in an aqueous alkali solution. Preferred examples thereof include polyhydroxystyrenes, novolak resins and derivatives thereof. Copolymers containing p-hydroxystyrene units can be used as long as they are alkali-soluble. Especially preferred are poly(p-hydroxysyrene), poly(p/m-hydroxystyrene) copolymer, poly(p/o-hydroxystyrene) copolymer, and poly(p-hydroxystyrene-styrene) copolymer. Poly(alkyl-substituted hydroxystyrene) resins such as poly(4-hydroxy-3-methylstyrene) resin and poly(4-hydroxy-3,5-dimethylstyrene) resin, and resins prepared by alkylating or acetylating part of phenolic OH groups of the above-described resins are also preferably used as long as they are alkali-soluble.

The resins in which part of phenol nuclei of the above resins (30 mol % or less of the whole phenol nuclei) are hydrogenated have improved transparency and are preferable in sensitivity, resolution and formation of rectangular profile.

Examples of the alkali-soluble resin for use in the present invention include novolak resins, hydrogenated novolak resins, acetone-pyrogallol resins, polyhydroxystyrene, alkyl-substituted polyhydroxystyrene, hydroxystyrene/N-substituted maleimide copolymers, partially O-alkylated poly(hydroxystyrene)s, partially O-acylated poly(hydroxystyrene)s, styrene/maleic anhydride copolymers, carboxylated methacrylic resins, and derivatives thereof, poly(styrene-hydroxystyrene) copolymer, and hydrogenated polyhydroxystyrene. However, the alkali-soluble resin for use in the present invention should not be construed as being limited to these examples.

Particularly preferred alkali-soluble resins include novolak resins, alkali-soluble resins containing p-hydroxystyrene units (preferably poly(p-hydroxystyrene), poly(p/m-hydroxystyrene) copolymer, poly(p/o-hydroxystyrene) copolymer, poly(p-hydroxystyrene-styrene) copolymer, poly(alkyl-substituted hydroxystyrene) resins such as poly(4-hydroxy-3-methylstyrene) resin and poly(4-hydroxy-3,5-dimethylstyrene) resin, and resins prepared by alkylating or acetylating part of phenolic OH groups of the above-described resins, partially hydrogenated polyhydroxystyrene resins, polyhydroxystyrene resins, partially hydrogenated novolak resins, and partially hydrogenated polyhydroxystyrene resins.

The terminology "polyhydroxystyrene" means a polymer obtained by polymerizing at least one monomer selected from the group consisting of p-hydroxystyrene monomer, m-hydroxystyrene monomer, o-hydroxystyrene monomer, and alkyl-substituted hydroxystyrene monomers in which the above-described monomers are substituted by an alkyl group having 1 to 4 carbon atoms at the ortho-position with respect to the hydroxyl group thereof.

The novolak resins are obtained by addition-condensing one or more given monomers as the main ingredient with one or more aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred of these is formaldehyde.

These aldehydes may be used alone or in combination of two or more thereof. Examples of the acid catalyst include hydrochloric acid, sulfuric acid, formic acid, acetic acid, and oxalic acid.

The addition amount of the alkali-soluble resin containing no acid-decomposable groups is preferably up to 50% by weight, more preferably up to 30% by weight, most preferably up to 20% by weight, based on the total amount of the alkali-soluble resin containing no acid-decomposable groups and the alkali-soluble resin containing an acid-decomposable group.

The photo-acid generator (c) is a compound which generates an acid by the irradiation of an actinic ray or radiation.

Examples of such photo-acid generators usable in combination with the specific photo-acid generator include photoinitiators for cationic photopolymerization, photoinitiators for radical photopolymerization, photodecolorants for dyes, optical color changers, and known compounds which generate an acid by the action of known light which is used in microresists, etc. such as ultraviolet ray having a wavelength of 400 to 200 nm, far-ultraviolet ray, especially, g-line, h-line, i-line, KrF exima laser light), ArF exima laser light, electron beam, X-ray, molecule ray, or ion beam. These photo-acid generators may be suitably used either alone or as a mixture of two or more thereof.

Specific examples thereof include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Pat. No. 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p. 478 Tokyo, October (1988), and U.S. Pat. Nos. 4,069,055 and 4,069,056; the iodonium salts described in, e.g., J. V. Crivello et al., Macromolecules, 10 (6), 1307 (1977), *Chem. & Eng. News*, November 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, and German Patents 2,904,626, 3,604,580, and 3,604,581; the selenonium salts described in, e.g., J. V. Crivello et al., *Macromolecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p. 478 Tokyo, October (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing,* 13 (4), 26 (1986), T. P. Gill et al., *Inorg. Chem.,* 19, 3007 (1980), D. Astruc, *Acc. Chem. Res.,* 19 (12), 377 (1896), and JP-A-2-161445; the photo-acid generators having an o-nitrobenzyl type protective group described in, e.g., S. Hayase et al., *J. Polymer Sci.,* 25, 753 (1987), E. Reichmanis et al., *J. Polymer Sci., Polymer Chem. Ed.,* 23, 1 (1985), Q. Q. Zhu et al., *J. Photochem.,* 36, 85, 39, 317 (1987), B. Amit et al., *Tetrahedron Lett.,* (24) 2205 (1973), D. H. R. Barton et al., *J. Chem Soc.,* 3571 (1965), P. M. Collins et al., *J. Chem. Soc.,* Perkin I, 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc., Chem. Commun.,* 532 (1972), S. Hayase et al., *Macromolecules,* 18, 1799 (1985), E. Reichmanis et al., *J. Electrochem. Soc., Solid State Sci. Technol.,* 130 (6), F. M. Houlihan et al., *Macromolecules,* 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints, Japan,* 35 (8), G. Berner et al., *J. Rad. Curing,* 13 (4), W. J. Mijs et al., *Coating Technol.,* 55 (697), 45 (1983), Akzo, H. Adachi et al., *Polymer Preprints, Japan,* 37 (3), European Patents 0,199,672, 84,515, 199,672, 044, 115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.,* 104, 5586 (1982), S. P. Pappas et al., *J. Imaging Sci.,* 30 (5), 218 (1986), S. Kondo et al., *Makromol. Chem., Rapid Commun.,* 9,625 (1988), Y. Yamada et al., *Makromol. Chem.,* 152, 153, 163 (1972), J. V. Crivello et al., *J. Polymer Sci., Polymer Chem. Ed.,* 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis,* (1), 1 (1980), A. Abad et al., *Tetrahedron Lett.,* (47) 4555 (1971), D. H. R. Barton et al., *J. Chem. Soc., (C),* 329 (1970), U.S. Pat. No. 3,779,778, and European Patent 126,712.

Of the optionally usable compounds enumerated above which generate an acid upon irradiation with actinic rays or a radiation, especially effective compounds are explained below.

(1) Trihalomethyl-substituted oxazole derivatives represented by the following formula (PAG1) and trihalomethyl-substituted s-triazine derivatives represented by the following general formula (PAG2).

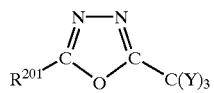
(PAG1)

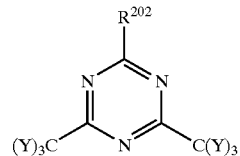
(PAG2)

In the above formulae, $R^{201}$ represents a substituted or unsubstituted aryl or alkenyl group; $R^{202}$ represents a substituted or unsubstituted aryl, alkenyl, or alkyl group (preferably those having 6 to 16 carbon atoms, e.g., phenyl, halogen-substituted phenyl, a $C_{1-4}$ alkyl- or alkoxy-phenyl, napthyl, styryl) or —$C(Y)_3$; and Y represents a chlorine or bromine atom.

Specific examples thereof are given below, but the compounds represented by general formula (PAG1) or (PAG2) should not be construed as being limited thereto.

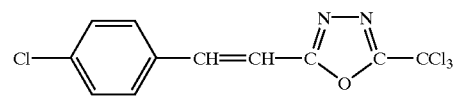
(PAG1-1)

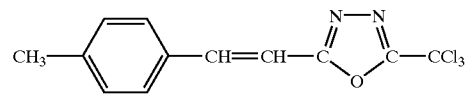
(PAG1-2)

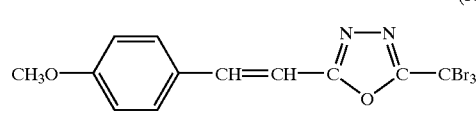
(PAG1-3)

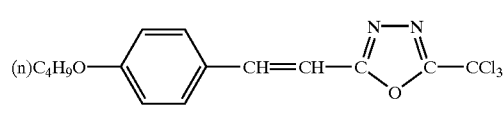
(PAG1-4)

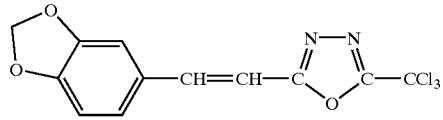
(PAG1-5)

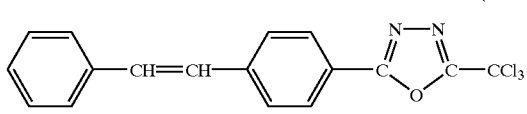
(PAG1-6)

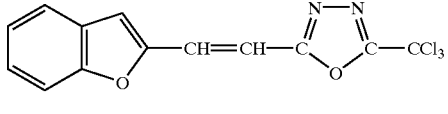
(PAG1-7)

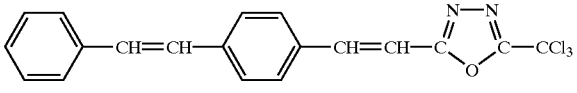
(PAG1-8)

(PAG2-1) 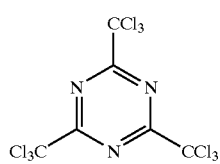
(PAG2-2) 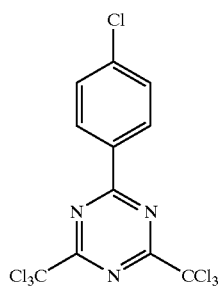
(PAG2-3) 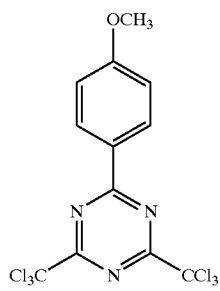
(PAG2-4) 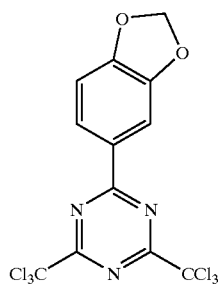
(PAG2-5) 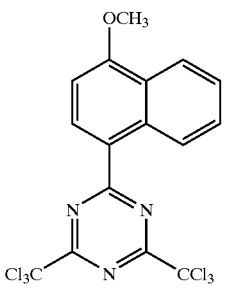
(PAG2-6) 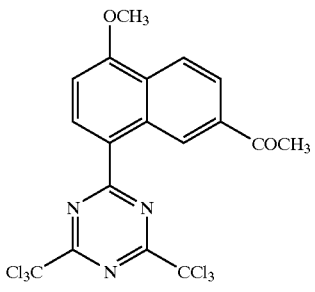
(PAG2-7) 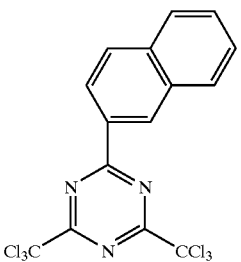
(PAG2-8) 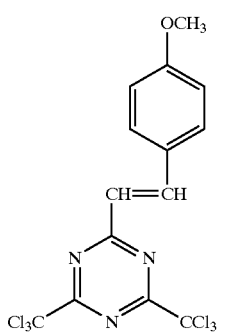
(PAG2-9) 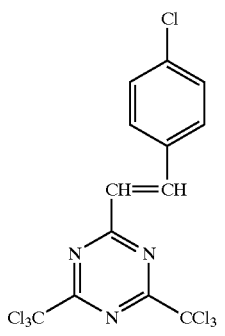
(PAG2-10) 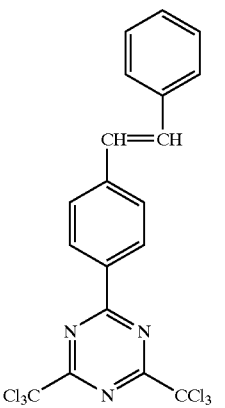
(2) Iodonium salts represented by the following general formula (PAG3) and sulfonium salts represented by the following general formula (PAG4).
(PAG3) 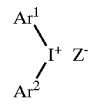

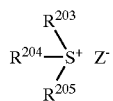 (PAG4)

In the above formulae, Ar¹ and Ar² each independently represents a substituted or unsubstituted aryl group (preferably those having 6 to 18 carbon atoms). Examples of the substituents include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom, and preferred are a halogen atom, an alkyl group such as methyl, ethyl, propyl and butyl, an alkoxy group such as methoxy, ethoxy, propoxy and butoxy, and a trifluoromethyl group. Preferred examples of the unsubstituted aryl group include those having 6 to 10 carbon atoms such as phenyl and naphtyl.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion, specifically a perfluoroalkanesulfonate anion, e.g., $CF_3SO_3^-$, or a pentafluorobenzenesulfonate anion.

Two of $R^{203}$, $R^{204}$, and $R^{205}$ may be bonded to each other through a single bond or substituent thereof. Ar¹ and Ar² may be bonded to each other likewise.

It is preferred to use a photo-acid generator which does not change the performance (T-Top formation, change of line width, and the like) so much with a lapse of time from exposure to heat treatment. Examples thereof include those of formula (PAG3) or (PAG4) in which $Ar_1$, $Ar_2$, and $R^{203}$ to $R^{205}$ are a substituted or unsubstituted aryl group, and $Z^-$ is one capable of forming an acid having relatively small diffusibility in the resist film with irradiation of actinic rays or radiation.

Specifically, $Z^-$ is an anion of benzene sulfonic acid, naphthalene sulfonic acid, or anthracene sulfonic acid, having at least one group selected from the group consisting of a branched or cyclic, alkyl or alkoxy group having 8 carbon atoms or more, at least two groups selected from the group consisting of a linear, branched or cyclic, alkyl or alkoxy group having 4 to 7 carbon atoms, or at least three groups selected from the group consisting of a linear or branched, alkyl or alkoxy group having 1 to 3 carbon atoms.

Specific examples thereof are given below, but the compounds represented by general formula (PAG3) or (PAG4) should not be construed as being limited thereto.

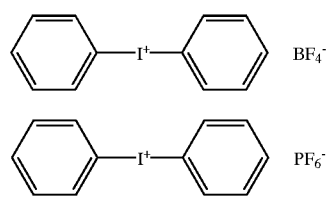

(PAG3-1)

(PAG3-2)

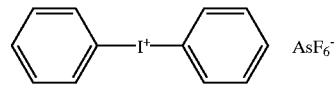 (PAG3-3)

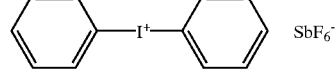 (PAG3-4)

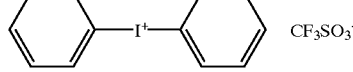 (PAG3-5)

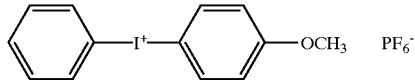 (PAG3-6)

 (PAG3-7)

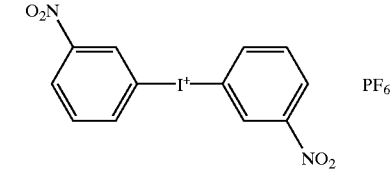 (PAG3-8)

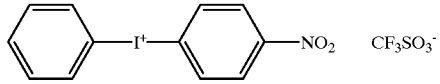 (PAG3-9)

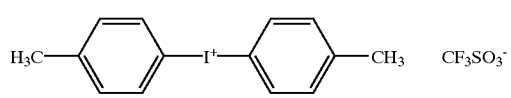 (PAG3-10)

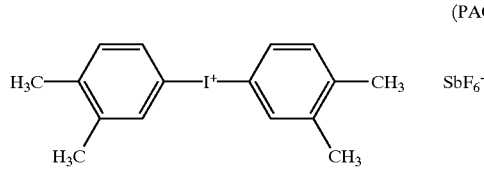 (PAG3-11)

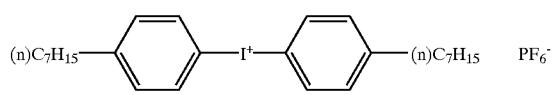 (PAG3-12)

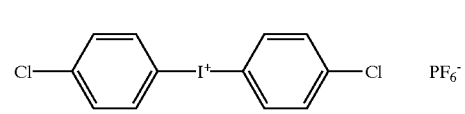 (PAG3-13)

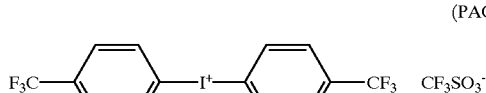 (PAG3-14)

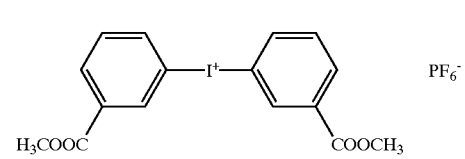 (PAG3-15)

-continued
(PAG3-16) 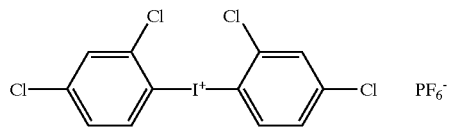 PF$_6^-$
(PAG3-17)  SbF$_6^-$
(PAG3-18)  PF$_6^-$
(PAG3-19) 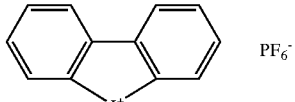 PF$_6^-$
(PAG3-20) 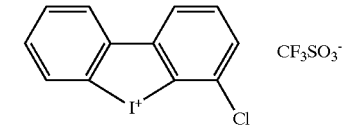 CF$_3$SO$_3^-$
(PAG3-21) 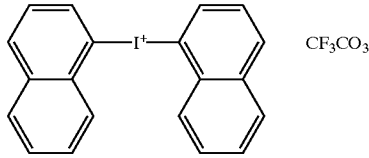 CF$_3$CO$_3^-$
(PAG3-22) 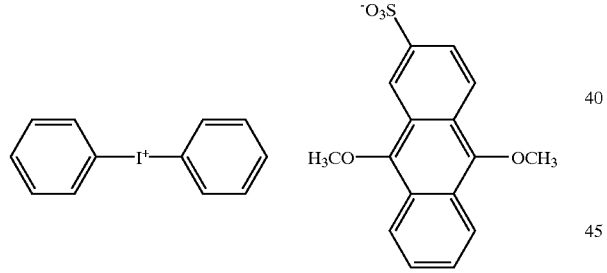
(PAG3-23) 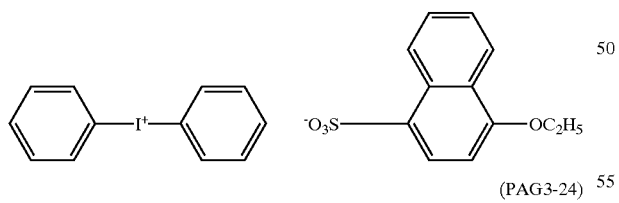
(PAG3-24) 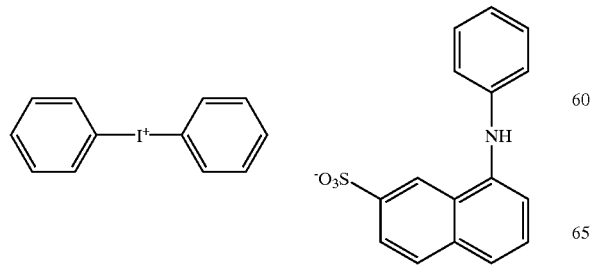
-continued
(PAG3-25) 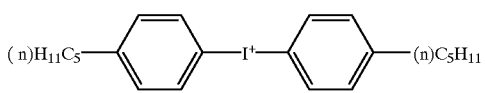
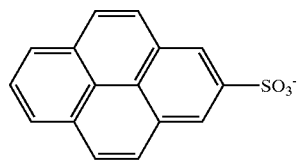
(PAG3-26) 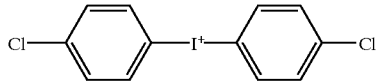
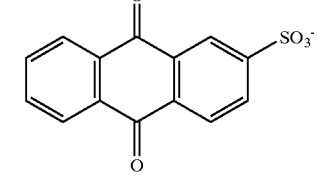
(PAG3-27) 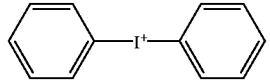
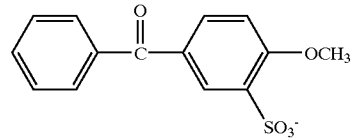
(PAG3-28) 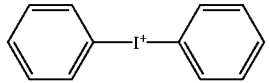
(PAG3-29) 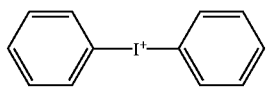
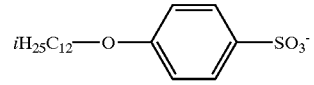
(PAG3-30) 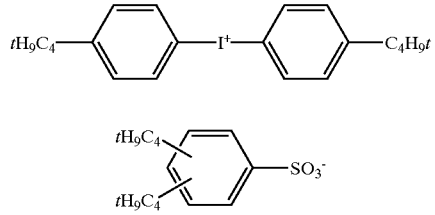

(PAG3-31)

(PAG3-32)

(PAG3-33)

(PAG3-34)

(PAG3-35)

(PAG3-36)

(PAG3-37)

(PAG-3-38)

(PAG3-39)

(PAG3-40)
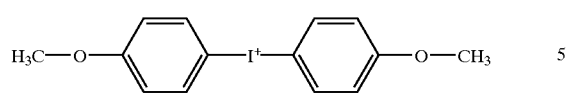
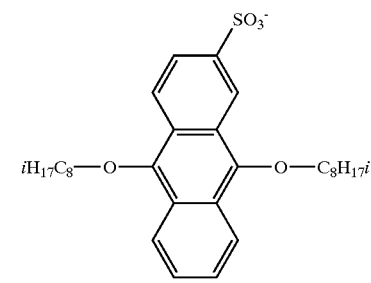
(PAG4-1)
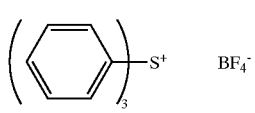 BF$_4^-$
(PAG4-2)
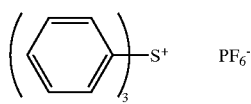 PF$_6^-$
(PAG4-3)
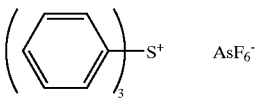 AsF$_6^-$
(PAG4-4)
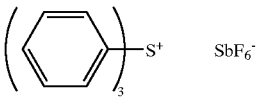 SbF$_6^-$
(PAG4-5)
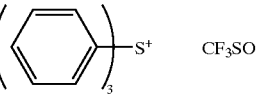 CF$_3$SO$_3^-$
(PAG4-6)
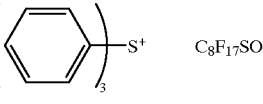 C$_8$F$_{17}$SO$_3^-$
(PAG4-7)
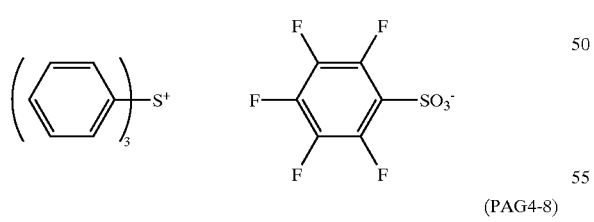
(PAG4-8)
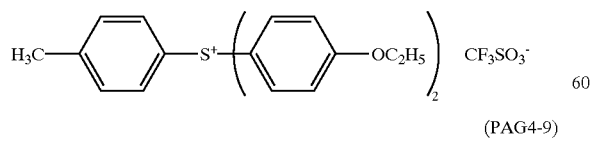 CF$_3$SO$_3^-$
(PAG4-9)
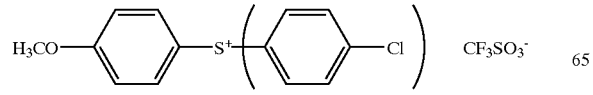 CF$_3$SO$_3^-$
(PAG4-10)
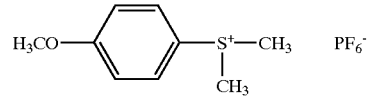 PF$_6^-$
(PAG4-11)
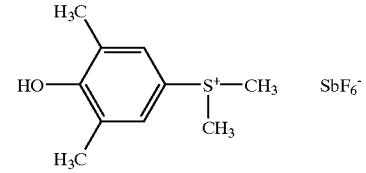 SbF$_6^-$
(PAG4-12)
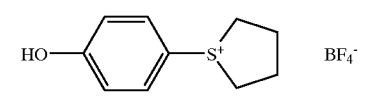 BF$_4^-$
(PAG4-13)
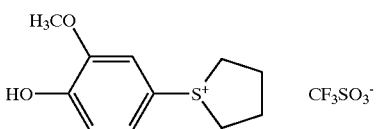 CF$_3$SO$_3^-$
(PAG4-14)
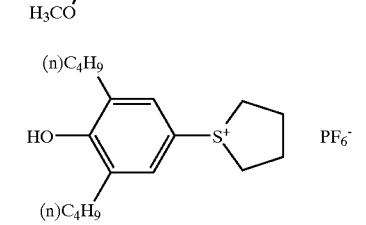 PF$_6^-$
(PAG4-15)
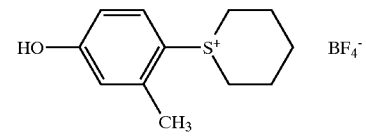 BF$_4^-$
(PAG4-16)
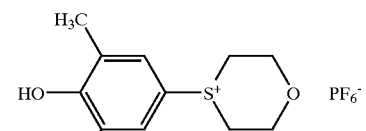 PF$_6^-$
(PAG4-17)
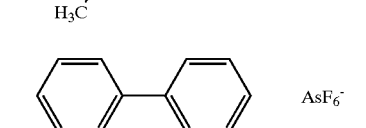 AsF$_6^-$
(PAG4-18)
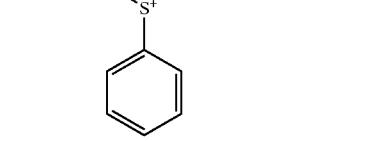 C$_8$F$_{17}$SO$_3^-$
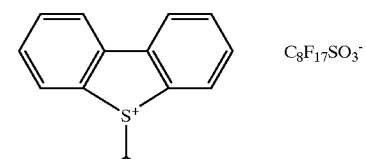

-continued
(PAG4-19) 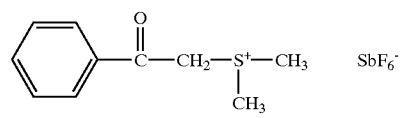
(PAG4-20) 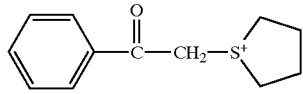
(PAG4-21) 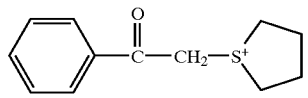
(PAG4-22) 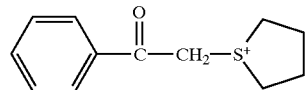
(PAG4-23) 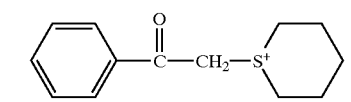
(PAG4-24) 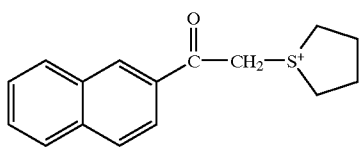
(PAG4-25) 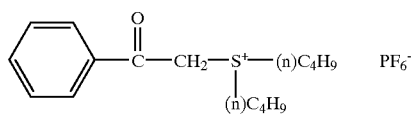
(PAG4-26) 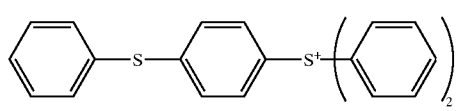
(PAG4-27) 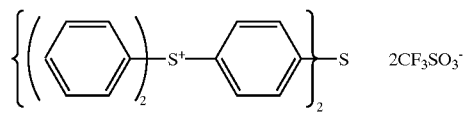
(PAG4-28) 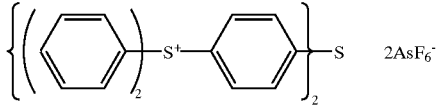
-continued
(PAG4-30) 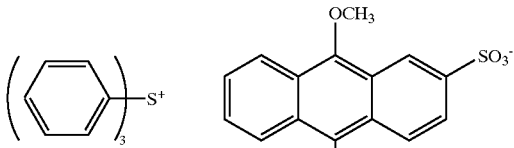
(PAG4-31) 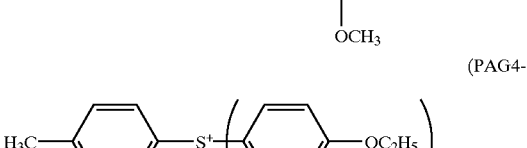
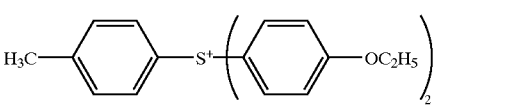
(PAG4-32) 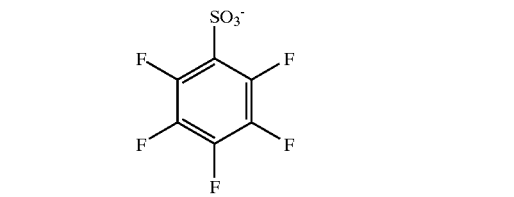
(PAG4-33) 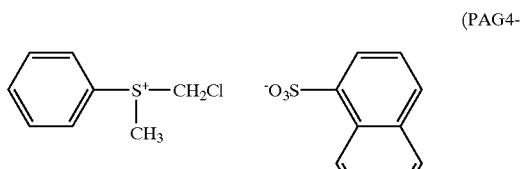
(PAG4-34) 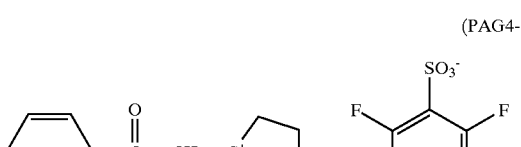
(PAG4-35) 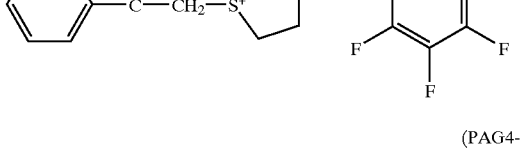

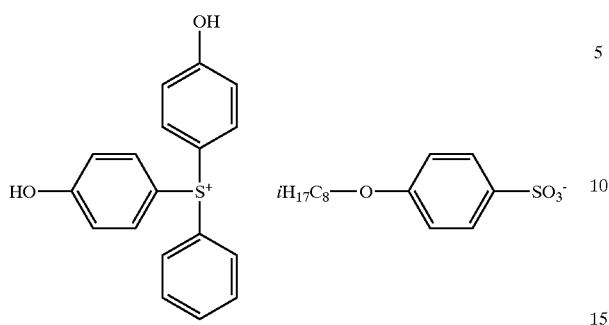
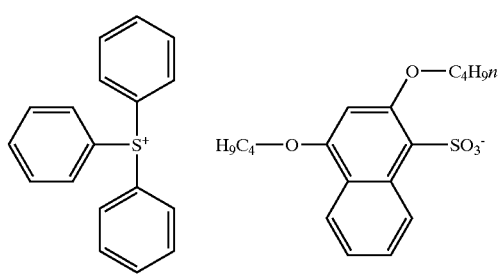
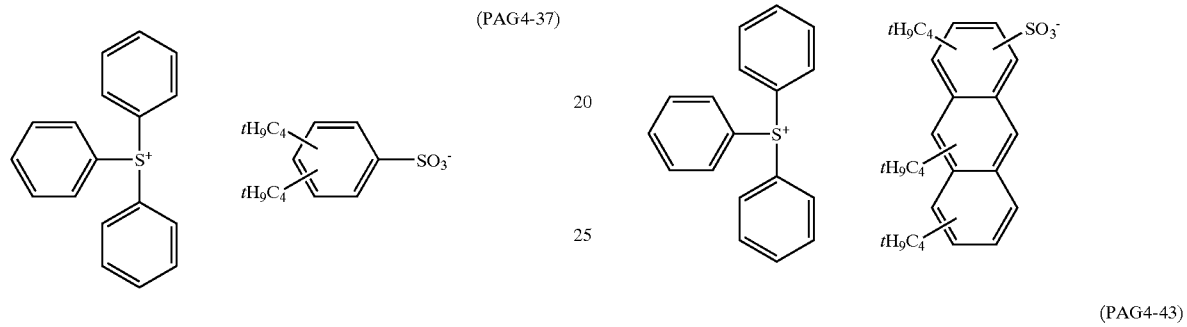

-continued (PAG4-46)

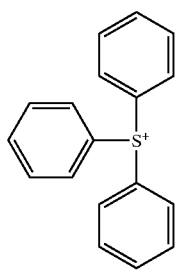 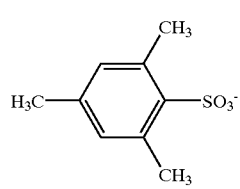

(PAG4-47)

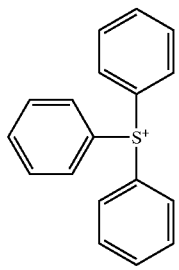 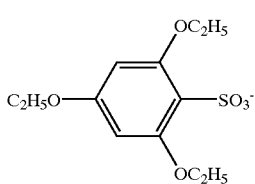

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2535 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

(PAG5)

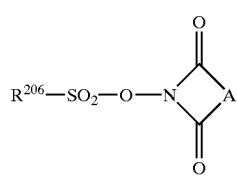

(PAG6)

In the above formulae, Ar3 and Ar4 each independently represents a substituted or unsubstituted aryl group; $R^{206}$ represents a substituted or unsubstituted alkyl or aryl group; and A represents a substituted or unsubstituted alkylene, alkenylene, or arylene group.

The substituted aryl group as $Ar^3$ and $Ar^4$ preferably has 6 to 18 carbon atoms. Examples of the substituent include a halogen atom, an alkyl group such as methyl, ethyl, propyl and butyl, an alkoxy group such as methoxy, ethoxy, propoxy and butoxy, and a trifluoromethyl group. Preferred examples of the unsubstituted aryl group as $Ar^3$ and $Ar^4$ include those having 6 to 10 carbon atoms such as phenyl and naphthyl.

The unsubstituted alkyl group as $R^{206}$ is preferably an alkyl group having 1 to 10 carbon atoms such as methyl, ethyl, propyl, butyl, pentyl, hexyl, heptyl, octyl, nonyl, and decyl. The unsubstituted aryl group as $R^{206}$ is preferably an aryl group having 6 to 10 carbon atoms such as phenyl and naphthyl. The substituted alkyl and aryl groups preferably have 6 to 14 carbon atoms. Examples of the substituent include an alkyl group, an alkoxy group, a cycloalkyl group and a trifluoromethyl group, each having 1 to 8 carbon atoms, and a halogen atom.

The unsubstituted alkylene, alkenylene, or arylene group as A preferably has 2 to 10 carbon atoms, and the substituted alkylene, alkenylene, or arylene group as A preferably has 2 to 14 carbon atoms. Examples of the substituent include an alkyl group, an alkoxy group, a cycloalkyl group, each having 1 to 6 carbon atoms, a phenyl group, a trifluoromethyl group, and a halogen atom.

Specific examples thereof are given below, but the compounds represented by general formula (PAG5) or (PAG6) should not be construed as being limited thereto.

(PAG5-1)

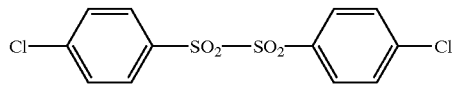

(PAG5-2)

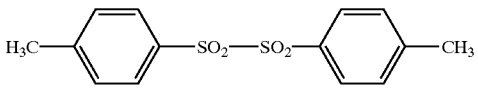

(PAG5-3)

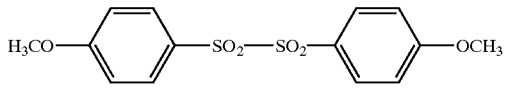

(PAG5-4)

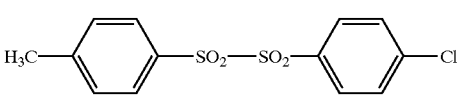

(PAG5-5)

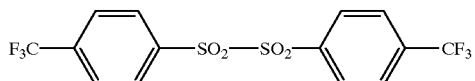

(PAG5-6)

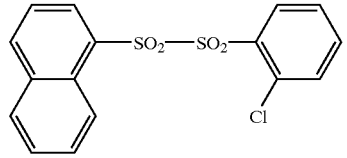

(PAG5-7)

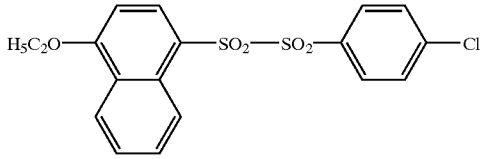

(PAG5-8)

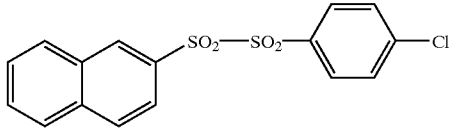

-continued (PAG5-9)
(PAG5-10)
(PAG5-11)
(PAG5-12)
(PAG5-13)
(PAG5-14)
(PAG6-1)
(PAG6-2)
(PAG6-3)
(PAG6-4)
(PAG6-5)
(PAG6-6)
(PAG6-7)
(PAG6-8)
(PAG6-9)
(PAG6-10)
(PAG6-11)

-continued

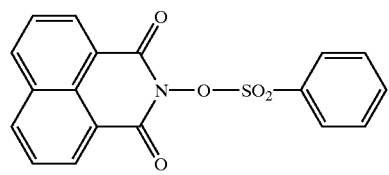
(PAG6-12)

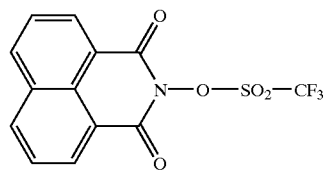
(PAG6-13)

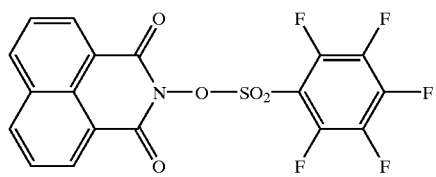
(PAG6-14)

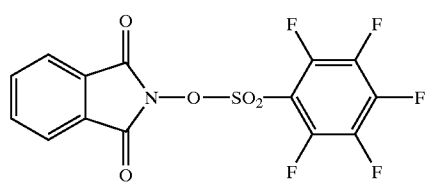
(PAG6-15)

In the present invention, it is preferred that Compound (c) which generates an acid with irradiation of actinic ray or radiation is selected from the onium salts, disulfones, 4-position DNQ sulfonates, and triazine compounds.

The addition amount of Compound (c) is generally from 0.001 to 40% by weight, preferably from 0.01 to 20% by weight, more preferably from 0.1 to 5% by weight, based on the total weight (excluding a coating solvent) of the positive photoresist composition. If the amount is less than 0.001% by weight, the sensitivity is reduced, and if it exceeds 40% by weight, light absorption of the resist is increased to thereby deteriorate the profile or reduce process (especially bake) margin.

The composition of the present invention can contain organic basic compounds, which improve the stability during storage and reduce the change in line width attributable to PED.

Desirable organic basic compounds usable in the present invention are compounds which are more strongly basic than phenol, in particular, nitrogen-containing basic compounds.

Preferred chemical environments include structures represented by the following formulae (A) to (E).

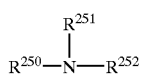
(A)

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

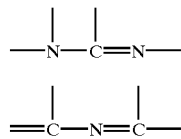
(B)

(C)

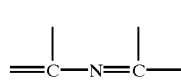
(D)

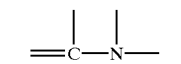
(E)

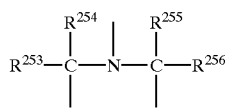

(In formula (E), $R^{253}$, $R^{254}$, $R^{255}$, and $R^{256}$ may be the same or different and each represents an alkyl group having 1 to 6 carbon atoms.)

Preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Examples of such preferred compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the effects of the present invention cannot be obtained. On the other hand, if it exceeds 10 parts by weight, reduced sensitivity and impaired developability at unexposed parts are liable to be caused.

The chemically amplified positive resist composition can further contain a surfactant, dye, pigment, plasticizer, photosensitizer, or a compound having at least two phenolic OH groups which accelates the solubility in a developing solution, if desired.

Examples of the surfactant include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company, Japan), Megafac F171 and F173 (manufactured by Dainippon Ink & Chemicals, Inc., Japan), Fluorad FC430 and FC431 (manufactured by Sumitomo 3M Ltd., Japan), Asahi Guard AG710 and Surflon S-382, SC101, SC102, SC103, SC104, SC105, and SC106 (manufactured by Asahi Glass Co., Ltd., Japan); organosiloxane polymer KP341 (manufactured by Shin-Etsu Chemical Co., Ltd., Japan); and acrylic or methacrylic (co)polymers Polyflow No. 75 and No. 95 (manufactured by Kyoeisha Chemical Co., Ltd., Japan). The surfactant may be added alone or in combination of two or more thereof. The preferred amount of the surfactant is from 0.0005 to 0.01 parts by weight per 100 parts by weight of the composition (excluding a solvent) of the present invention.

Dyes suitable for use in the present invention are oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd., Japan), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to exhibit absorption in a region of longer wavelengths than far ultraviolet, whereby the photosensitive composition of the present invention can be rendered sensitive to an i- or g-line. Examples of spectral sensitizers suitable for use in the present invention include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

As the compounds having at least two phenolic OH groups which accelate the solubility in a developing solution, polyhydroxy compounds can be exemplified. Preferred examples thereof include phenols, resorcin, phloroglucin, phloroglucide, 2,3,4-trihydroxybenzophenone, 2,3,4,4'-tetrahydroxybenzophenone, $\alpha,\alpha',\alpha''$-tris(4-hydroxyphenyl)-1,3,5-triisopropylbenzene, tris(4-hydroxyphenyl)methane, tris(4-hydroxyphenyl)ethane, and 1,1'-bis (4-hydroxypheyl) cyclohexane.

For application to a substrate, the photosensitive composition of the present invention is used in the form of a solution in a solvent (component (d)) in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture thereof. The solvent can be added in such an amount that the solid components in the resist composition is generally from 1 to 40% by weight, preferably from 7 to 25% by weight based on the resist composition.

A satisfactory resist pattern can be obtained by applying the photosensitive composition described above on a substrate such as those for use in the production of precision integrated-circuit elements (e.g., silicon/silicon dioxide coating) by an appropriate coating means, e.g., a spinner or coater, exposing the coating to light through a mask, and then baking and developing the coating.

As a developing solution for the photosensitive composition of the present invention, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The present invention will be explained below in more detail by reference to Examples, but the invention should not be construed as being limited thereto.

The present invention will be explained below in more detail by reference to Examples, but the invention should not be construed as being limited thereto.

SYNTHESIS EXAMPLE I-1

Synthesis of Vinyl Ether

A 256 g (2.4 mol) portion of chloroethyl vinyl ether was mixed with 82 g (1.0 mol) of sodium acetate and 2 g of tetra-n-butylammonium iodide. This mixture was heated with refluxing at 80 to 90° C. for 8 hours. After the reaction mixture was cooled to room temperature, the salt generated was taken out of the reaction mixture by filtration and extracted with 200 ml of diethyl ether. This ether extract was added to the reaction mixture, and the ether and the chloroethyl vinyl ether remaining unreacted were removed with an evaporator.

The oily residue obtained was subjected twice to vacuum distillation in the presence of calcium hydride to obtain 2-acetoxyethyl vinyl ether, which is a colorless compound represented by the following formula X-1.

SYNTHESIS EXAMPLES I-2, I-3, AND I-4

Three vinyl ethers were synthesized using N,N-dimethylformamide as a solvent in the same manner as in Synthesis Example I-1 (through recrystallization from methanol). That is, ethyl (2-(vinyloxy)ethyl)malonate represented by the following formula X-2 was obtained from chloroethyl vinyl ether and sodium diethylmalonate.

2-Vinyloxyethylphthalimide represented by the following formula X-3 was obtained from chloroethyl vinyl ether and potassium phthalimide.

Furthermore, 2-benzoyloxyethyl vinyl ether, which is represented by the following formula X-4, was obtained from chloroethyl vinyl ether and sodium benzoate.

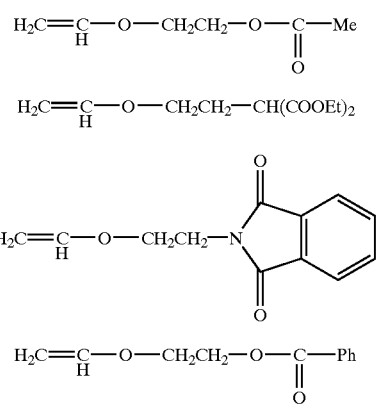

SYNTHESIS EXAMPLE II-1

In 120 ml of butyl acetate was dissolved 32.4 g (0.2 mol) of p-acetoxystyrene. Three 0.033 g portions of azobisisobutyronitrile (AIBN) were added at an interval of 2.5 hours to the solution with stirring at 80° C. in a nitrogen stream and stirring was thereafter continued for 5 hours, whereby polymerization reaction was conducted. The resultant reaction mixture was poured into 1,200 ml of hexane to precipitate a white resin. The resin obtained was dried and then dissolved in 150 ml of methanol. Thereto was added an aqueous solution prepared by dissolving 7.7 g (0.19 mol) of sodium hydroxide in 50 ml of water. This mixture was heated with refluxing for 3 hours to hydrolyze the resin. Thereafter, the reaction mixture was diluted with 200 ml of water and neutralized with hydrochloric acid to precipitate a white resin. This resin was taken out by filtration, washed with water, dried, and then dissolved in 200 ml of tetrahydrofuran to give a solution, which was added dropwise to 5 L of ultrapure water with vigorous agitation to conduct reprecipitation. This reprecipitation operation was repeated three times. The resin thus obtained was dried in a vacuum dryer at 120° C. for 12 hours to obtain poly(p-hydroxystyrene) as alkali-soluble resin R-1.

The resin obtained had a weight-average molecular weight of 15,000.

SYNTHESIS EXAMPLE II-2

In 100 ml of tetrahydrofuran were dissolved 35.25 g (0.2 mol) of p-tert-butoxystyrene and 5.21 g (0.05 mol) of styrene which both had been purified by dehydration and distillation in an ordinary way. Three 0.033 g portions of azobisisobutyronitrile (AIBN) were added at an interval of 2.5 hours to the solution with stirring at 80° C. in a nitrogen stream and stirring was thereafter continued for 5 hours, whereby polymerization reaction was conducted. The resultant reaction mixture was poured into 1,200 ml of hexane to precipitate a white resin. The resin obtained was dried and then dissolved in 150 ml of tetrahydrofuran.

Thereto was added 4 N hydrochloric acid. This mixture was heated with refluxing for 6 hours to hydrolyze the resin. Thereafter, the reaction mixture was poured into 5 L of ultrapure water to reprecipitate a resin. This resin was taken out by filtration, washed with water, dried, and then dissolved in 200 ml of tetrahydrofuran to give a solution, which was added dropwise to 5 L of ultrapure water with vigorous agitation to conduct reprecipitation. This reprecipitation operation was repeated three times. The resin thus obtained was dried in a vacuum dryer at 120° C. for 12 hours to obtain a p-hydroxystyrene/styrene copolymer as alkali-soluble resin R-2.

The resin obtained had a weight-average molecular weight of 12,000.

SYNTHESIS EXAMPLE II-3

In 120 ml of butyl acetate were dissolved 32.4 g (0.2 mol) of p-acetoxystyrene and 7.01 g (0.07 mol) of methyl methacrylate. Three 0.033 g portions of azobisisobutyronitrile (AIBN) were added at an interval of 2.5 hours to the solution with stirring at 80° C. in a nitrogen stream and stirring was thereafter continued for 5 hours, whereby polymerization reaction was conducted. The resultant reaction mixture was poured into 1,200 ml of hexane to precipitate a white resin. The resin obtained was dried and then dissolved in 200 ml of methanol.

Thereto was added an aqueous solution prepared by dissolving 7.7 g (0.19 mol) of sodium hydroxide in 50 ml of water. This mixture was heated with refluxing for 1 hour to hydrolyze the resin. Thereafter, the reaction mixture was diluted with 200 ml of water and neutralized with hydrochloric acid to precipitate a white resin. This resin was taken out by filtration, washed with water, dried, and then dissolved in 200 ml of tetrahydrofuran to give a solution, which was added dropwise to 5 L of ultrapure water with vigorous agitation to conduct reprecipitation. This reprecipitation operation was repeated three times. The resin thus obtained was dried in a vacuum dryer at 120° C. for 12 hours to obtain a p-hydroxystyrene/methyl methacrylate copolymer as alkali-soluble resin R-3. The resin obtained had a weight-average molecular weight of 10,000.

SYNTHESIS EXAMPLE II-4

Poly(p-hydroxystyrene) (VP 8000) manufactured by Nippon Soda Co., Ltd. was used as alkali-soluble resin R-4. This resin had a weight-average molecular weight of 9,800.

In 200 ml of tetrahydrofuran was dissolved 50 g of the resin R-4. Thereto was added 3.27 g (0.042 mol) of acetyl chloride. To this mixture was added dropwise, with stirring, 4.21 g (0.042 mol) of triethylamine. Thereafter, the resultant mixture was added dropwise to 5 L of ultrapure water with vigorous agitation to conduct reprecipitation. This reprecipitation operation was repeated three times. The resin thus obtained was dried in a vacuum dryer at 120° C. for 12 hours to obtain a p-hydroxystyrene/p-acetoxystyrene copolymer as alkali-soluble resin R-5. The resin obtained had a weight-average molecular weight of 10,000.

SYNTHESIS EXAMPLE III-1

The following ingredients were mixed together in a flask.

| | |
|---|---|
| Alkali-soluble resin R-5, obtained in Synthesis Example II-4 | 20 g |
| Tetrahydrofuran | 80 ml |
| Vinyl ether X-1, obtained in Synthesis Example I-1 | 6.50 g |
| Thereto was added | |
| p-Toluenesulfonic acid | 10 mg. |

This mixture was stirred at room temperature for 18 hours.

The resultant reaction mixture was added dropwise to 5 L of ultrapure water with vigorous agitation to conduct reprecipitation.

The resin thus obtained was dried in a vacuum dryer at 70° C. for 12 hours to obtain alkali-soluble resin A-1 having substituents according to the present invention.

SYNTHESIS EXAMPLES III-2 TO III-10

Using the alkali-soluble resins and vinyl ethers shown in Table 1 given below, alkali-soluble resins A-2 to A-10 having substituents according to the present invention were obtained in the same manner as in Synthesis Example III-1.

SYNTHESIS EXAMPLES IV-1 TO IV-4

Resins C-1 to C-4 were obtained from the alkali-soluble resins shown in Table 1 given below and from ethyl vinyl ether (Y-1), isobutyl vinyl ether (Y-2), or chloroethyl vinyl ether (Y-3) which are represented by the following formulae in the same manner as in Synthesis Example III-1.

TABLE 1

$H_2C{=}\underset{H}{C}{-}O{-}CH_2CH_3$  Y-1

$H_2C{=}\underset{H}{C}{-}O{-}CH_2CH{\diagup}^{CH_3}_{\diagdown CH_3}$  Y-2

$H_2C{=}\underset{H}{C}{-}O{-}CH_2CH_2{-}Cl$  Y-3

| No. | Resin | Alkali-Soluble Resin Kind | Amount (g) | Vinyl Ether Kind | Amount (g) | Molecular Weight | Molecular Weight Distribution |
|---|---|---|---|---|---|---|---|
| III-1 | A-1 | R-5 | 20 | X-1 | 6.50 | 10,100 | 1.07 |
| III-2 | A-2 | R-4 | 20 | X-2 | 11.50 | 10,000 | 1.07 |
| III-3 | A-3 | R-4 | 20 | X-3 | 10.85 | 10,300 | 1.07 |
| III-4 | A-4 | R-4 | 20 | X-4 | 9.60 | 10,200 | 1.08 |
| III-5 | A-5 | R-1 | 20 | X-1 | 5.20 | 15,000 | 2.97 |
| III-6 | A-6 | R-2 | 20 | X-1 | 4.16 | 12,500 | 2.48 |
| III-7 | A-7 | R-3 | 20 | X-1 | 3.64 | 10,100 | 2.01 |
| III-8 | A-8 | R-5 | 20 | X-1 | 4.68 | 11,000 | 1.08 |
| III-9 | A-9 | R-2 | 20 | X-2 | 7.36 | 12,600 | 2.58 |
| III-10 | A-10 | R-5 | 20 | X-4 | 9.22 | 10,400 | 1.07 |
| IV-1 | C-1 | R-4 | 20 | Y-1 | 3.60 | 10,400 | 1.07 |
| IV-2 | C-2 | R-4 | 20 | Y-2 | 5.00 | 10,500 | 1.07 |
| IV-3 | C-3 | R-2 | 20 | Y-1 | 2.88 | 12,500 | 2.60 |
| IV-4 | C-4 | R-5 | 20 | Y-3 | 4.50 | 10,500 | 1.07 |

SYNTHESIS EXAMPLE V-1

The following ingredients were mixed together in a flask.

| | |
|---|---|
| Alkali-soluble resin R-4 | 20 g |
| N,N-Dimethylacetamide | 80 g |
| Di-t-butyl dicarbonate (Z-1) | 7.25 g |
| Triethylamine | 16.84 g |

This mixture was stirred at room temperature for 18 hours.

The resultant reaction mixture was added dropwise to 5 L of ultrapure water with vigorous agitation to conduct reprecipitation. The resin thus obtained was sufficiently washed with ultrapure water and then dried in a vacuum dryer at 70° C. for 12 hours to obtain alkali-soluble resin B-1 having substituents according to the present invention.

SYNTHESIS EXAMPLE V-2

The following ingredients were mixed together in a flask.

| | |
|---|---|
| Alkali-soluble resin R-4 | 20 g |
| N,N-Dimethylacetamide | 80 g |
| t-Butyl bromoacetate (Z-2) | 8.12 g |
| potassium carbonate | 6.90 g |

This mixture was stirred at 120° C. for 18 hours.

The resultant reaction mixture was allowed to cool and then added dropwise to 5 L of ultrapure water with vigorous agitation to conduct reprecipitation. The resin thus obtained was sufficiently washed with ultrapure water and then dried in a vacuum dryer at 70° C. for 12 hours to obtain alkali-soluble resin B-2 having substituents according to the present invention.

SYNTHESIS EXAMPLES V-3 TO V-5

Alkali-soluble resins B-3 to B-5 having substituents according to the present invention were obtained from the alkali-soluble resins shown in Table 2 given below and from di-t-butyl dicarbonate or t-butyl bromoacetate, according to Synthesis Example V-1 or V-2.

TABLE 2

| Synthesis Example No. | Resin | Alkali-Soluble Resin | | Reactant | | Molecular Weight | Molecular Weight Distribution |
|---|---|---|---|---|---|---|---|
| | | Kind | Amount (g) | Kind | Amount (g) | | |
| V-1 | B-1 | R-4 | 20 | Z-1 | 7.25 | 10,400 | 1.07 |
| V-2 | B-2 | R-4 | 20 | Z-2 | 8.12 | 10,200 | 1.07 |
| V-3 | B-3 | R-1 | 20 | Z-1 | 6.49 | 15,200 | 3.00 |
| V-4 | B-4 | R-2 | 20 | Z-2 | 5.80 | 12,500 | 2.47 |
| V-5 | B-5 | R-5 | 20 | Z-2 | 4.35 | 10,800 | 1.09 |

EXAMPLES 1 TO 10 AND COMPARATIVE EXAMPLES 1 TO 8

Preparation and Evaluation of Photosensitive Compositions

Each ingredient combination shown in Table 3 given below was dissolved in 8 g of PGMEA (propylene glycol monoethyl ether acetate). The resultant solution was filtered through a 0.2 μm filter to prepare a resist solution. Each resist solution thus obtained was applied to a silicon wafer with a spin coater, and the coating was dried at 130° C. for 60 seconds with a vacuum holding type hot plate to obtain a resist film having a thickness of 0.8 μm.

The photo-acid generators and organic basic compounds used in the Examples are shown below.

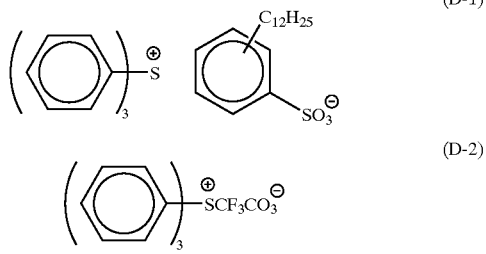

TABLE 3

| Example No. | Resin A | | Resin B | | Photo-acid Generator | | Organic Basic Compound | |
|---|---|---|---|---|---|---|---|---|
| | Kind | Amount (g) | Kind | Amount (g) | Kind | Amount (g) | Kind | Amount (g) |
| Examples | | | | | | | | |
| 1 | A-1 | 0.80 | B-1 | 0.80 | D-1 | 0.80 | E-3 | 0.005 |
| 2 | A-2 | 1.00 | B-2 | 0.60 | D-1 | 0.80 | E-3 | 0.004 |
| 3 | A-3 | 1.20 | B-3 | 0.40 | D-1 | 0.80 | E-3 | 0.004 |
| 4 | A-4 | 0.60 | B-4 | 1.00 | D-1 | 0.80 | E-3 | 0.004 |
| 5 | A-5 | 0.40 | B-5 | 1.20 | D-1 | 0.80 | — | — |
| 6 | A-6 | 0.80 | B-1 | 0.80 | D-2 | 0.80 | — | — |
| 7 | A-7 | 0.80 | B-2 | 0.80 | D-2 | 0.80 | E-2 | 0.004 |
| 8 | A-8 | 0.80 | B-3 | 0.80 | D-3 | 0.80 | — | — |
| 9 | A-9 | 0.80 | B-4 | 0.70 | D-3 | 0.80 | E-1 | 0.003 |
| 10 | A-10 | 0.80 | B-5 | 0.60 | D-2 | 0.80 | — | — |
| Comparative Examples | | | | | | | | |
| 1 | C-1 | 0.80 | B-1 | 0.80 | D-1 | 0.80 | E-3 | 0.005 |
| 2 | C-2 | 0.80 | B-2 | 0.80 | D-2 | 0.80 | E-3 | 0.004 |
| 3 | C-3 | 0.80 | B-3 | 0.80 | D-3 | 0.80 | E-3 | 0.003 |
| 4 | C-4 | 0.80 | B-1 | 0.80 | D-1 | 0.80 | E-3 | 0.004 |
| 5 | A-1 | 1.60 | — | — | D-1 | 0.80 | E-3 | 0.005 |
| 6 | A-2 | 1.60 | — | — | D-2 | 0.80 | E-3 | 0.005 |
| 7 | — | — | B-1 | 0.80 | D-1 | 0.80 | E-3 | 0.005 |
| 8 | — | — | B-2 | 1.60 | D-2 | 0.80 | E-3 | 0.005 |

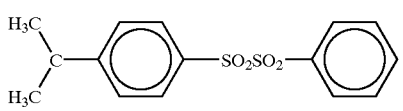 (D-3)

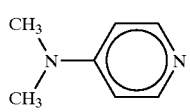 (E-1)

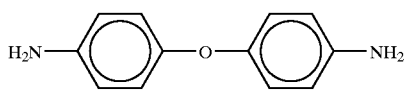 (E-2)

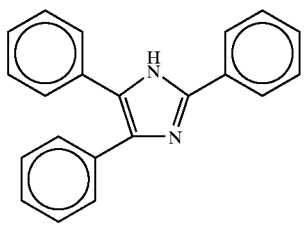 (E-3)

These resist films were exposed to light using a 248 nm KrF excimer laser stepper (NA=0.45). After the exposure, the resist films each was heated with a 100° C. hot plate for 60 seconds, immediately thereafter immersed in 0.26 N aqueous tetramethylammonium hydroxide (TMAH) solution for 60 seconds, rinsed with water for 30 seconds, and then dried. The thus-obtained resist patterns on silicon wafers were examined with a scanning electron microscope to evaluate resist performance. The results obtained are shown in Table 4.

Resolution is expressed in terms of threshold resolution in the exposure amount necessary for reproducing a mask pattern having 0.40 μm lines and spaces. The reproducibility of isolated patterns in the above exposure amount was evaluated in the following three grades.

The resist films which gave isolated patterns having line widths which were from 90 to 100% of the desired line width (0.30 μm) are rated as A; those which gave isolated patterns in which the line widths were from 50 to 90% of the desired width are rated as B; and those which gave isolated patterns having line widths below 50% of the desired width or which failed to give isolated patterns are rated as C.

TABLE 4

| No. | Threshold Resolution | Reproducibility of Isolated patterns |
|---|---|---|
| Examples | | |
| 1 | 0.25 | A |
| 2 | 0.26 | A |
| 3 | 0.25 | A |
| 4 | 0.25 | A |
| 5 | 0.26 | A |
| 6 | 0.25 | A |
| 7 | 0.26 | A |
| 8 | 0.26 | A |

TABLE 4-continued

| No. | Threshold Resolution | Reproducibility of Isolated patterns |
|---|---|---|
| 9 | 0.25 | A |
| 10 | 0.25 | A |
| Comparative Examples | | |
| 1 | 0.27 | B |
| 2 | 0.27 | C |
| 3 | 0.27 | B |
| 4 | 0.27 | B |
| 5 | 0.25 | C |
| 6 | 0.26 | C |
| 7 | 0.26 | B |
| 8 | 0.26 | C |

The results given in Table 4 show that the positive photoresist compositions obtained in the Examples according to the present invention each gave satisfactory results, whereas the photoresist compositions obtained in the Comparative Examples were unsatisfactory especially in the dimensional reproducibility of isolated patterns.

SYNTHESIS EXAMPLE III'-1

The following ingredients were mixed together in a flask.

| | |
|---|---|
| Alkali-soluble resin R-5, obtained in Synthesis Example II-4 | 20 g |
| Tetrahydrofuran | 80 ml |
| Vinyl ether X-1, obtained in Synthesis Example I-1 | 4.33 g |
| Thereto was added | |
| p-Toluenesulfonic acid | 10 mg. |

This mixture was stirred at room temperature for 18 hours.

The resultant reaction mixture was added dropwise to 5 L of ultrapure water with vigorous agitation to conduct reprecipitation.

The resin thus obtained was dried in a vacuum dryer at 70° C. for 12 hours to obtain alkali-soluble resin A'-1 having substituents according to the present invention.

SYNTHESIS EXAMPLES III'-2 TO III'-10

Using the alkali-soluble resins and vinyl ethers shown in Table 5 given below, alkali-soluble resins A'-2 to A'-10 having substituents according to the present invention were obtained in the same manner as in Synthesis Example III'-1.

SYNTHESIS EXAMPLES IV'-1 TO IV'-4

Resins C'-1 to C'-4 were obtained from the alkali-soluble resins shown in Table 5 given below and from ethyl vinyl ether (Y-1), isobutyl vinyl ether (Y-2), or chloroethyl vinyl ether (Y-3) which are represented by the following formulae in the same manner as in Synthesis Example III'-1.

TABLE 5

| | | H$_2$C=CH—O—CH$_2$CH$_3$ | | | | Y-1 |

| | | H$_2$C=CH—O—CH$_2$CH(CH$_3$)$_2$ | | | | Y-2 |

| | | H$_2$C=CH—O—CH$_2$CH$_2$—Cl | | | | Y-3 |

| | | Alkali-Soluble Resin | | Vinyl Ether | | Mole- | Molecular |
| | | | Amount | | Amount | cular | Weight |
| No. | Resin | Kind | (g) | Kind | (g) | Weight | Distribution |
| --- | --- | --- | --- | --- | --- | --- | --- |
| III'-1 | A'-1 | R-5 | 20 | X-1 | 4.33 | 10,000 | 1.07 |
| III'-2 | A'-2 | R-4 | 20 | X-2 | 7.67 | 10,000 | 1.07 |
| III'-3 | A'-3 | R-4 | 20 | X-3 | 9.04 | 10,200 | 1.07 |
| III'-4 | A'-4 | R-4 | 20 | X-4 | 6.40 | 10,100 | 1.08 |
| III'-5 | A'-5 | R-1 | 20 | X-1 | 6.07 | 15,100 | 2.99 |
| III'-6 | A'-6 | R-2 | 20 | X-1 | 3.25 | 12,400 | 2.45 |
| III'-7 | A'-7 | R-3 | 20 | X-1 | 2.17 | 10,100 | 2.00 |
| III'-8 | A'-8 | R-5 | 20 | X-1 | 4.33 | 10,500 | 1.08 |
| III'-9 | A'-9 | R-2 | 20 | X-2 | 9.58 | 12,900 | 2.60 |
| III'-10 | A'-10 | R-5 | 20 | X-4 | 8.00 | 10,300 | 1.07 |
| IV'-1 | C'-1 | R-4 | 20 | Y-1 | 2.40 | 10,300 | 1.07 |
| IV'-2 | C'-2 | R-4 | 20 | Y-2 | 4.17 | 10,400 | 1.07 |
| IV'-3 | C'-3 | R-2 | 20 | Y-1 | 3.60 | 12,700 | 2.60 |
| IV'-4 | C'-4 | R-5 | 20 | Y-3 | 3.55 | 10,300 | 1.07 |

SYNTHESIS EXAMPLE V'-1.

To a solution of 8.48 g (0.020 mol) of α,α',α"-tris(4-hydroxyphenyl)-1,3,5-triisopropylbenzene in 120 ml of N,N-dimethylacetamide were added 4.2 g (0.03 mol) of potassium carbonate and 12.3 g (0.063 g) of t-butyl bromoacetate. This mixture was stirred at 120° C. for 7 hours. The resultant reaction mixture was poured into 1.5 L of water and extracted with ethyl acetate. The ethyl acetate extract was dried with magnesium sulfate, subsequently concentrated, and then purified by column chromatography [carrier: silica gel, developing solvent: ethyl acetate/n-hexane=2/8 (by volume)] to obtain 13 g of the desired compound. Through NMR spectrometry, this compound was ascertained to be nonpolymeric dissolution inhibitive compound [B'-1], used in Examples and Comparative Examples.

SYNTHESIS EXAMPLE V'-2

The same procedure as in Synthesis Example [V'-1] was conducted, except that 6.6 g of 1,3,3,5-tetrakis(4-hydroxyphenyl)pentane was used in place of α,α',α"-tris(4-hydroxyphenyl)-1,3,5-triisopropylbenzene. Thus, nonpolymeric dissolution inhibitive compound [B'-2] was synthesized.

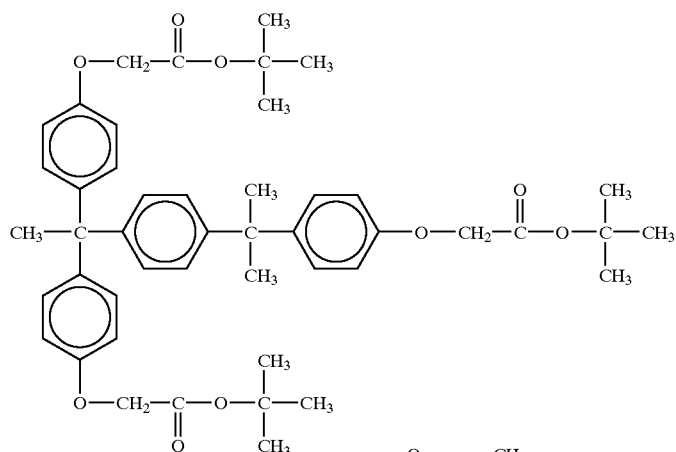

(B'-1)

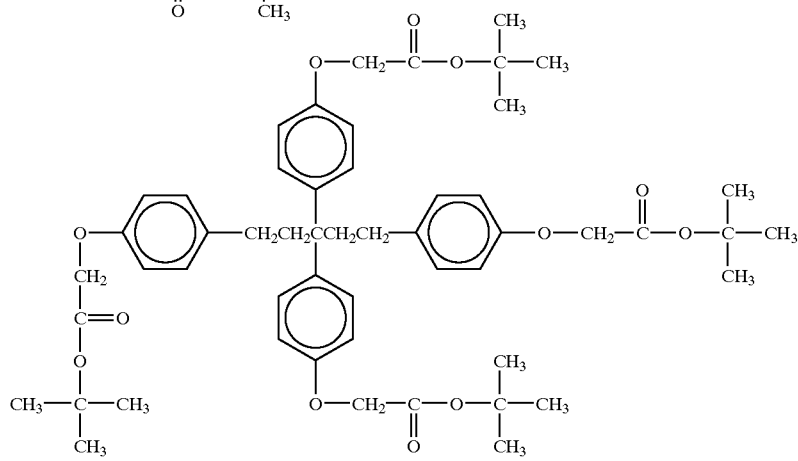

(B'-2)

EXAMPLES 11 TO 20 AND COMPARATIVE EXAMPLES 9 TO 14

Preparation and Evaluation of Photosensitive Compositions

Each ingredient combination shown in Table 2 given below was dissolved in 8 g of PGMEA (propylene glycol monoethyl ether acetate). The resultant solution was filtered through a 0.2 μm filter to prepare a resist solution. Each resist solution thus obtained was applied to a silicon wafer with a spin coater, and the coating was dried at 130° C. for 60 seconds with a vacuum holding type hot plate to obtain a resist film having a thickness of 0.8 μm.

TABLE 6

| No. | Resin A Kind | Resin A Amount (g) | Nonpolymeric Dissolution Inhibitive Compound (B') Kind | Nonpolymeric Dissolution Inhibitive Compound (B') Amount (g) | Photo-acid Generator Kind | Photo-acid Generator Amount (g) | Organic Basic Compound Kind | Organic Basic Compound Amount (g) |
| --- | --- | --- | --- | --- | --- | --- | --- | --- |
| Examples | | | | | | | | |
| 11 | A'-1 | 1.20 | B'-1 | 0.40 | D-1 | 0.08 | E-3 | 0.004 |
| 12 | A'-2 | 1.25 | B'-2 | 0.30 | D-1 | 0.08 | E-3 | 0.005 |
| 13 | A'-3 | 1.30 | B'-1 | 0.35 | D-1 | 0.08 | E-3 | 0.004 |
| 14 | A'-4 | 1.40 | B'-2 | 0.20 | D-1 | 0.08 | E-3 | 0.004 |
| 15 | A'-5 | 1.40 | B'-1 | 0.15 | D-2 | 0.08 | — | — |
| 16 | A'-6 | 1.20 | B'-2 | 0.40 | D-2 | 0.08 | — | — |
| 17 | A'-7 | 1.30 | B'-1 | 0.25 | D-3 | 0.08 | E-2 | 0.003 |
| 18 | A'-8 | 1.40 | B'-2 | 0.20 | D-3 | 0.08 | E-1 | 0.004 |
| 19 | A'-9 | 1.00 | B'-1 | 0.50 | D-1 | 0.08 | E-3 | 0.005 |
| 20 | A'-10 | 1.35 | B'-2 | 0.25 | D-2 | 0.08 | E-3 | 0.007 |
| Comparative Examples | | | | | | | | |
| 9 | C'-1 | 1.20 | B'-1 | 0.40 | D-1 | 0.08 | E-3 | 0.004 |
| 10 | C'-2 | 1.25 | B'-2 | 0.30 | D-1 | 0.08 | E-3 | 0.005 |
| 11 | C'-3 | 1.30 | B'-1 | 0.35 | D-1 | 0.08 | E-3 | 0.004 |
| 12 | C'-4 | 1.40 | B'-2 | 0.20 | D-1 | 0.08 | E-3 | 0.004 |
| 13 | A'-1 | 1.55 | — | — | D-1 | 0.08 | E-3 | 0.004 |
| 14 | A'-2 | 1.55 | — | — | D-1 | 0.08 | E-3 | 0.004 |

D-1) to (D-3) and (E-1) to (E-3) are the same as those above.

These resist films were exposed to light using a 248 nm KrF excimer laser stepper (NA=0.45). After the exposure, the resist films each was heated with a 110° C. hot plate for 60 seconds, immediately thereafter immersed in 0.26 N aqueous tetramethylammonium hydroxide (TMAH) solution for 60 seconds, rinsed with water for 30 seconds, and then dried. The thus-obtained resist patterns on silicon wafers were examined with a scanning electron microscope to evaluate resist performance. The results obtained are shown in Table 7.

Resolution is expressed in terms of threshold resolution in the exposure amount necessary for reproducing a mask pattern having 0.40 μm lines and spaces. Scum generation was evaluated in the following three grades after each 0.30 μm pattern obtained in that exposure amount was examined with a scanning electron microscope for a development residue. The patterns in which no scum was observed are rated as A; those in which a scum was observed in lower parts thereof but not observed between lines (i.e., in spaces) are rated as B; and those in which a scum was observed between lines (i.e., in spaces) are rated as C.

TABLE 7

| No. | Threshold Resolution | Scum Generation |
| --- | --- | --- |
| Examples | | |
| 11 | 0.25 | A |
| 12 | 0.25 | A |
| 13 | 0.26 | A |
| 14 | 0.25 | A |
| 15 | 0.26 | A |
| 16 | 0.25 | A |
| 17 | 0.26 | A |
| 18 | 0.26 | A |
| 19 | 0.25 | A |
| 20 | 0.25 | A |

TABLE 7-continued

| No. | Threshold Resolution | Scum Generation |
| --- | --- | --- |
| Comparative Examples | | |
| 9 | 0.27 | B |
| 10 | 0.27 | B |
| 11 | 0.27 | B |
| 12 | 0.27 | B |
| 13 | 0.26 | C |
| 14 | 0.26 | C |

The results given in Table 7 show that the positive photoresist compositions obtained in the Examples according to the present invention each gave satisfactory results. Namely, The results given in Table 7 show that the positive photoresist compositions obtained in the Examples according to the present invention each gave satisfactory results. Namely, these compositions were excellent in both resolution and the prevention of scum generation. In contrast, none of the photoresist compositions obtained in the Comparative Examples satisfied both resolution and the prevention of scum generation, and these compositions were unsatisfactory especially in scum generation.

According to the present invention, an excellent, chemically amplified positive photoresist composition can be provided which has improved dimensional reproducibility of isolated patterns or is prevented from generating a scum after development while having high resolution.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising:

(a) Resin A obtained from an alkali-soluble resin containing phenolic hydroxyl groups by replacing from 10 to 80% of the phenolic hydroxyl groups each with a group represented by formula (I);

(b) Resin B obtained from an alkali-soluble resin containing phenolic hydroxyl groups by replacing from 10 to 80% of the phenolic hydroxyl groups each with a group represented by formula (II) or (III);

(c) a compound which generates an acid upon irradiation with actinic rays or a radiation; and (d) a solvent,

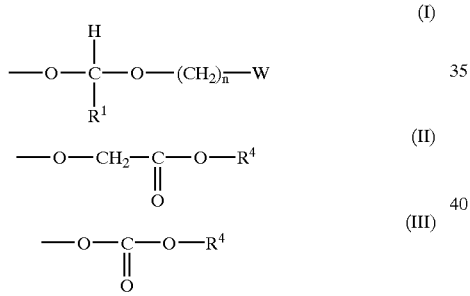

wherein $R^1$ represents a substituent selected from alkyl groups having 1 to 4 carbon atoms; W represents either an organic residue containing at least one atom selected from oxygen, nitrogen, sulfur, phosphorus, and silicon atoms or an atomic group selected from the group consisting of an amino group, an ammonium group, and a mercapto group;

n represents a natural number of from 1 to 4; and $R^4$ represents a linear, branched, or cyclic alkyl group having 1 to 6 carbon atoms.

2. The positive photoresist composition of claim 1, wherein W in formula (I) for component (a) is a group selected from the group consisting of the following substituents:

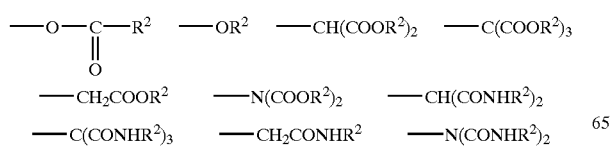

-continued

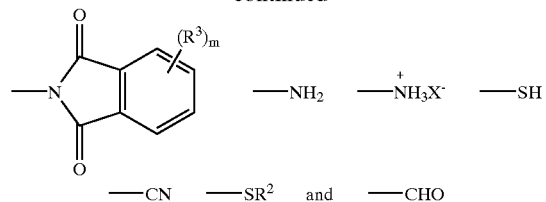

wherein $R^2$ represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group, and a substituted or unsubstituted aralkyl group;

$R^3$ represents a hydrogen atom or a substituent selected from the group consisting of a linear, branched, or cyclic alkyl group having 1 to 6 carbon atoms, a linear, branched, or cyclic alkoxy group having 1 to 6 carbon atoms, a halogen atom, a nitro group, an amino group, a hydroxyl group, and a cyano group;

X represents a halogen atom; and m represents a natural number of from 1 to 4.

3. The positive photoresist composition of claim 1, wherein the alkali-soluble resin containing phenolic hydroxyl groups used for Resin A and/or Resin B is poly (p-hydroxystyrene).

4. A positive photoresist composition comprising:

(a) Resin A obtained from an alkali-soluble resin containing phenolic hydroxyl groups by replacing from 10 to 80% of the phenolic hydroxyl groups each with a group represented by formula (I);

(b) a nonpolymeric dissolution inhibitive compound which has at least one kind of group selected from tertiary alkyl ester groups and tertiary alkyl carbonate groups, is capable of enhancing solubility in aqueous alkali solutions by the action of an acid and is a compound in which each structure has at least two acid-decomposable groups and the two acid-decomposable groups farthest apart from each other are separated from each other by at least 10 bonding atoms excluding those contained in the acid-decomposable groups, or is a compound in which each structure has at least three acid-decomposable groups and the two acid-decomposable groups farthest apart from each other are separated from each other by at least 9 bonding atoms excluding those contained in the acid-decomposable groups;

(c) a compound which generates an acid upon irradiation with actinic rays or a radiation;

(d) a solvent, and (e) an organic basic compound,

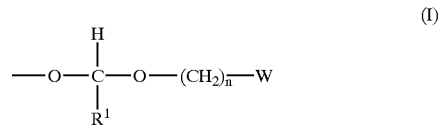

wherein $R^1$ represents a substituent selected from alkyl groups having 1 to 4 carbon atoms; n represents a natural number of from 1 to 4; and W represents a group selected from the group consisting of the following substituents:

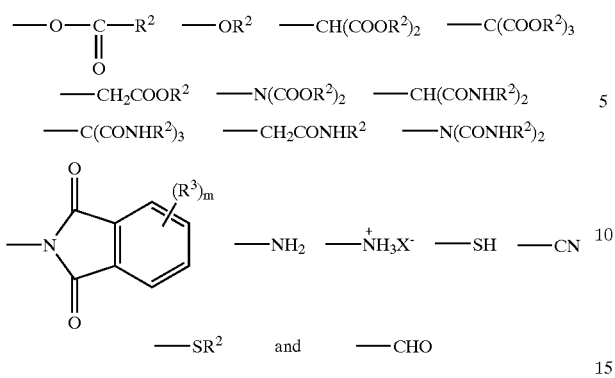

wherein
R² represents a hydrogen atom or a substituent selected from the group consisting of a linear, branched, or cyclic alkyl group having 1 to 6 carbon atoms, a linear, branched, or cyclic alkenyl group having 2 to 6 carbon atoms, a substituted or unsubstituted aryl group, and a substituted or unsubstituted aralkyl group;
R³ represents a hydrogen atom or a substituent selected from the group consisting of a linear, branched, or cyclic alkyl group having 1 to 6 carbon atoms, a linear, branched, or cyclic alkoxy group having 1 to 6 carbon atoms, a halogen atom, a nitro group, an amino group, a hydroxyl group, and a cyano group;
X represents a halogen atom; and m represents a natural number of from 1 to 4.

5. The positive photoresist composition of claim 4, wherein the alkali-soluble resin containing phenolic hydroxyl groups used for Resin A is poly(p-hydroxystyrene).

6. The positive photoresist composition of claim 4, wherein the organic basic compound has a structure selected from the structures represented by formulae (A) to (E):

 (A)

wherein $R^{250}$, $R^{251}$ and $R^{252}$ may be the same or different and each represents a hydrogen atom, an alkyl group having 1 to 6 carbon atoms, an aminoalkyl group having 1 to 6 carbon atoms, a hydroxylalkyl group having 1 to 6 carbon atoms, or a substituted or unsubstituted aryl group having 6 to 20 carbon atoms, provided that $R^{250}$ and $R^{251}$ may be bonded to each other to form a ring;

 (B)

 (C)

 (D)

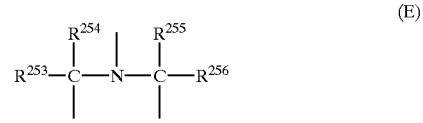 (E)

wherein $R^{253}$, $R^{254}$, $R^{255}$ and $R^{256}$ may be the same or different and each represents an alkyl group having 1 to 6 carbon atoms.

7. The positive photoresist composition of claim 4, wherein the nonpolymeric dissolution inhibitive compound is a compound obtained from a single-structure compound having a molecular weight of 3,000 or lower and containing three or more alkali-soluble groups per molecule by protecting at least half of the alkali-soluble groups with acid-decomposable groups.

8. The positive photoresist composition of claim 7, wherein the upper limit of the number of bonding atoms present between the acid-decomposable groups which expresses the distance between the groups, excluding the atoms contained in the group is 50.

* * * * *